(12) United States Patent
Li et al.

(10) Patent No.: US 10,692,563 B2
(45) Date of Patent: Jun. 23, 2020

(54) SEMICONDUCTOR MEMORY DEVICE AND MEMORY SYSTEM

(71) Applicant: TOSHIBA MEMORY CORPORATION, Minato-ku, Tokyo (JP)

(72) Inventors: Shan Li, Kanagawa (JP); Keigo Hara, Kanagawa (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 48 days.

(21) Appl. No.: 15/695,866

(22) Filed: Sep. 5, 2017

(65) Prior Publication Data

US 2018/0268891 A1 Sep. 20, 2018

(30) Foreign Application Priority Data

Mar. 15, 2017 (JP) .................... 2017-049975

(51) Int. Cl.

| G11C 7/04 | (2006.01) |
|---|---|
| G11C 11/408 | (2006.01) |
| G11C 11/406 | (2006.01) |
| G11C 11/4074 | (2006.01) |
| G11C 11/4099 | (2006.01) |
| G11C 8/08 | (2006.01) |
| G11C 11/4091 | (2006.01) |
| G11C 16/26 | (2006.01) |
| G11C 11/56 | (2006.01) |
| G11C 16/04 | (2006.01) |
| G11C 7/14 | (2006.01) |

(52) U.S. Cl.
CPC ............ *G11C 11/4085* (2013.01); *G11C 7/04* (2013.01); *G11C 8/08* (2013.01); *G11C 11/4074* (2013.01); *G11C 11/4091* (2013.01); *G11C 11/4099* (2013.01); *G11C 11/40626* (2013.01); *G11C 11/56* (2013.01); *G11C 11/5642* (2013.01); *G11C 16/0483* (2013.01); *G11C 16/26* (2013.01); *G11C 7/14* (2013.01)

(58) Field of Classification Search
CPC ............................ G11C 7/04; G11C 16/0483
See application file for complete search history.

(56) References Cited

U.S. PATENT DOCUMENTS

| 2009/0310408 A1* | 12/2009 | Lee .................... G11C 11/5628 365/185.03 |
|---|---|---|
| 2014/0071761 A1 | 3/2014 | Sharon et al. |
| 2015/0042488 A1* | 2/2015 | Bell ...................... H02J 13/00 340/870.02 |
| 2016/0103625 A1 | 4/2016 | Fujimoto et al. |
| 2016/0239235 A1* | 8/2016 | Chung ................. G06F 3/0629 |
| 2016/0266972 A1 | 9/2016 | Yamaki et al. |
| 2018/0061504 A1* | 3/2018 | Kim ........................ G11C 7/04 |

* cited by examiner

*Primary Examiner* — Huan Hoang
*Assistant Examiner* — Jay W. Radke
(74) *Attorney, Agent, or Firm* — Foley & Lardner LLP

(57) ABSTRACT

A semiconductor memory device includes a memory cell transistor, a word line coupled to the memory cell transistor, a temperature detection element configured to detect a temperature, and a control unit. The control unit is configured to determine, responsive to receiving a first command from a controller, a compensation value for a read voltage designated by the controller according to the detected temperature, and to lock updating of the compensation value.

10 Claims, 17 Drawing Sheets

FIG. 6

| TEMPERATURE T [°C] | TEMPERATURE COMPENSATION VALUE dV OF READ VOLTAGE |
|---|---|
| 85≤T<110 | 0.0 |
| 60≤T<85 | 0.05 |
| 35≤T<60 | 0.1 |
| 10≤T<35 | 0.15 |

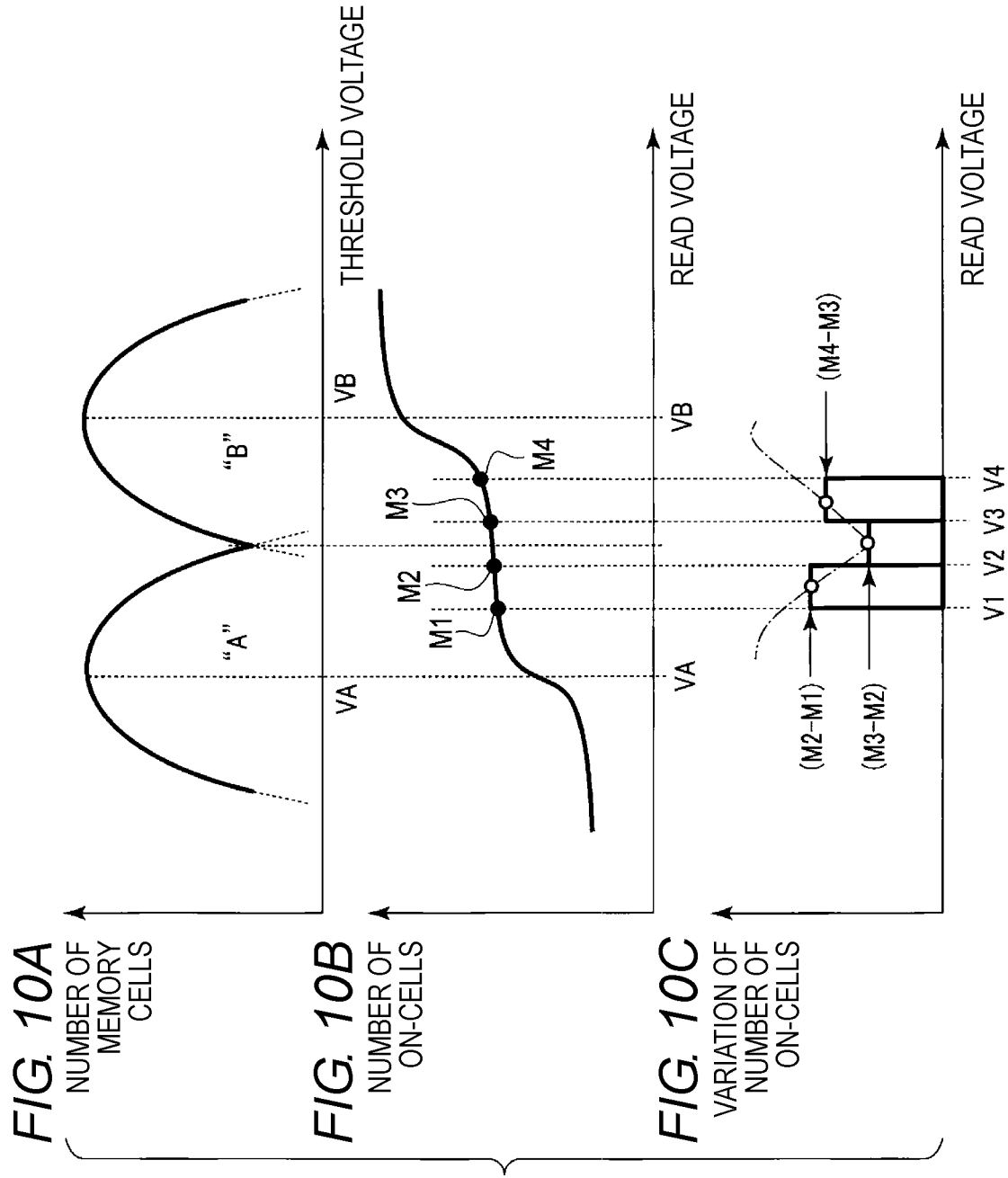

FIG. 15

| NUMBER OF LOOPS n | SHIFT AMOUNT [V] |
|---|---|
| 0 | 0 |
| 1 | $-\Delta$ |
| 2 | $-2\Delta$ |
| 3 | $-3\Delta$ |
| 4 | $\Delta$ |
| 5 | $2\Delta$ |
| 6 (=N) | $3\Delta$ |

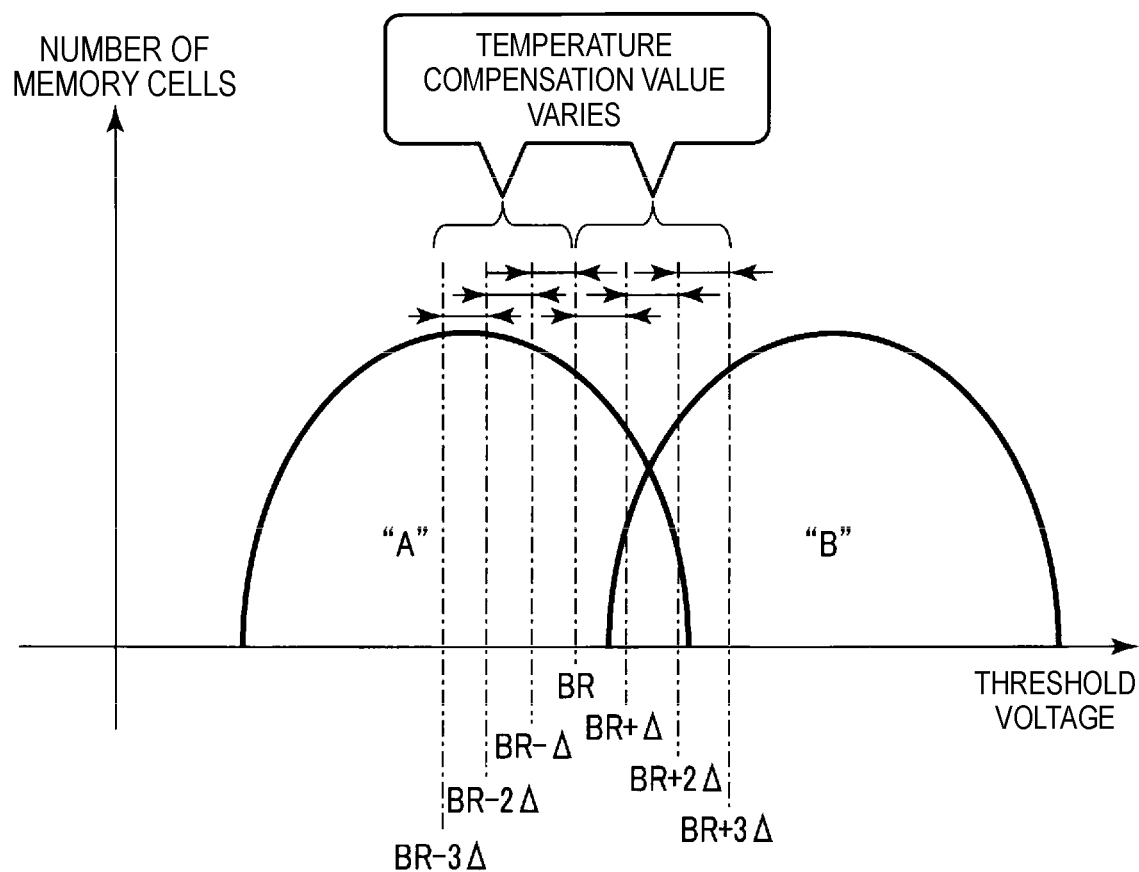

SEMICONDUCTOR MEMORY DEVICE AND MEMORY SYSTEM

CROSS-REFERENCE TO RELATED APPLICATION

This application claims the benefit of and priority to Japanese Patent Application No. 2017-049975, filed Mar. 15, 2017, the entire contents of which are incorporated herein by reference.

FIELD

One or more embodiments described herein relate generally to a semiconductor memory device and a memory system.

BACKGROUND

Some memory systems include a negative-AND (NAND) type flash memory as a semiconductor memory device and a controller that controls the NAND type flash memory.

DESCRIPTION OF THE DRAWINGS

FIG. 6 is a table for describing example temperature compensation values applied during operation of the semiconductor memory device according to the first aspect.

FIG. 10A, FIG. 10B and FIG. 10C are schematic views for describing an outline of one or more embodiments of a Vth tracking operation of the semiconductor memory device according to the first aspect.

FIG. 15 is a table for describing one or more embodiments of the soft bit reading operation of the semiconductor memory device according to the first aspect.

FIG. 17 is a schematic view for describing an outline of an operation of the semiconductor memory device according to a comparative example.

DETAILED DESCRIPTION

Figure 1:
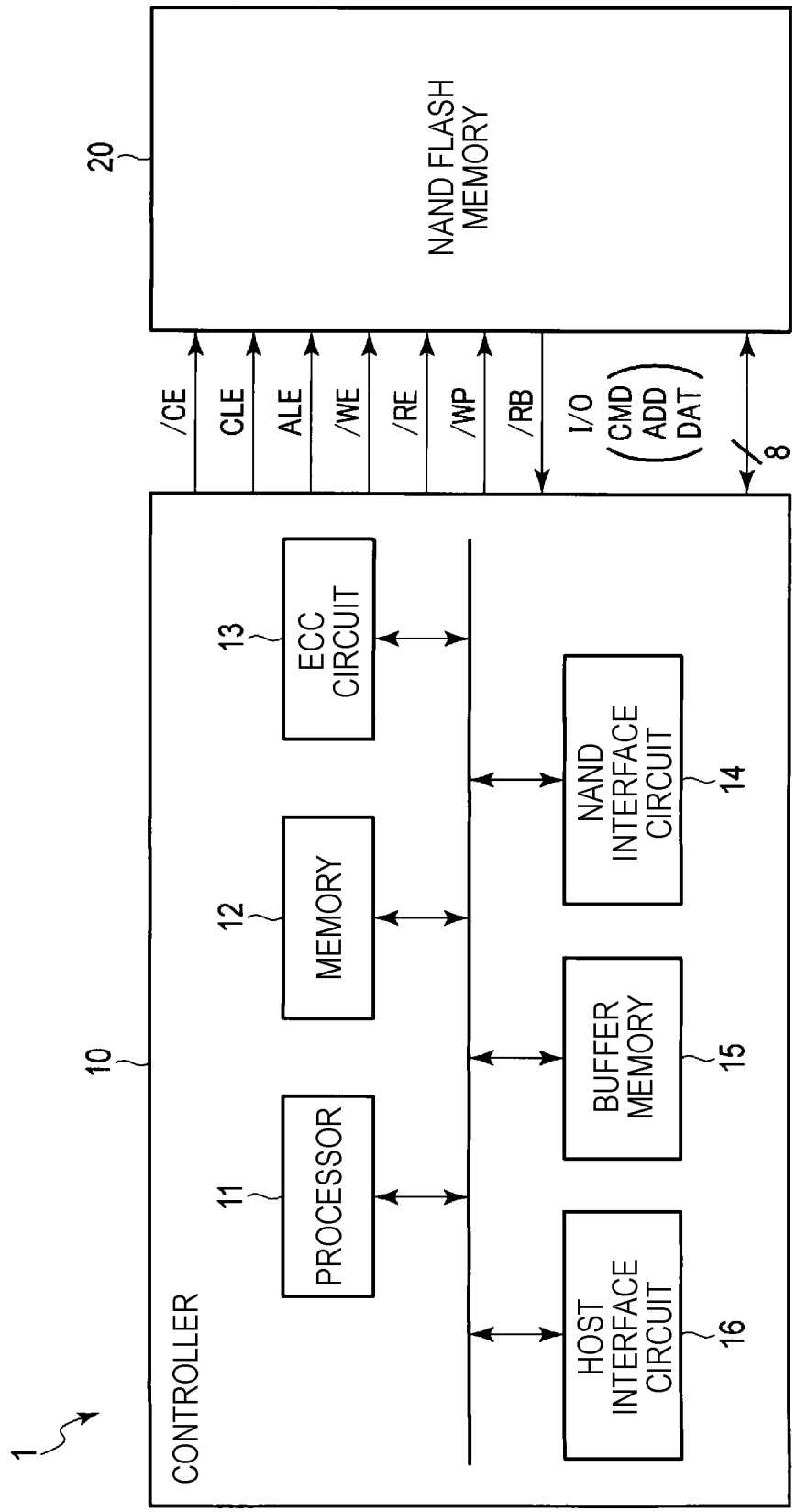
FIG. 1 is a block diagram for describing the configuration of one or more embodiments of a memory system according to a first aspect.

One or more embodiments described herein provide for suppressing deterioration in data reading accuracy of a memory device.

One or more embodiments of a semiconductor memory device include a memory cell transistor, a word line coupled to the memory cell transistor, a temperature detecting element configured to detect a temperature, and a control unit. The control unit is configured to determine, responsive to receiving a first command from a controller, a compensation value for a read voltage designated by the controller according to the detected temperature, and to lock updating of the compensation value.

One or more embodiments of a method for performing a read operation include determining, by a controller, that a read error has occurred, and implementing, by the controller, a tracking operation. The method further includes determining, by the controller, a standard read value based on the tracking operation, and performing, by the controller, a read operation using the standard read value.

Hereinafter, one or more embodiments will be described with reference to the drawings. In the following description, a common reference numeral may be given to components having the same or similar functions and configurations. Further, when plural components having a common reference numeral are distinguished from each other, subscripts may be added to the common reference numeral so as to distinguish the components. In addition, in the case where the plural components need not particularly be distinguished from each other, the subscript may be omitted.

1. First Aspect

One or more embodiments of a semiconductor memory device according to a first aspect will be described.

1.1 Configuration

First, a configuration of one or more embodiments of a semiconductor memory device according to the first aspect will be described.

1.1.1 Overall Configuration of Memory System

A configuration example of the memory system according to the first aspect will be described with reference to FIG. 1. FIG. 1 is a block diagram illustrating one example of a configuration of a memory system according to a first aspect. The memory system 1 communicates with, for example, an external host device (not illustrated). The memory system 1 stores data from the host device (not illustrated) and further, reads the data to the host device.

As illustrated in FIG. 1, the memory system 1 includes a controller 10 and a semiconductor memory device (e.g. a NAND flash memory) 20. The controller 10 receives a command from the host device and controls the semiconductor memory device 20 based on the received command. The controller 10 writes the data instructed to be written from the host device to the semiconductor memory device 20, and the controller 10 reads the data instructed to be read from the semiconductor memory device 20 and transmits the read data to the host device. The controller 10 is electrically connected to the semiconductor memory device 20 by a NAND bus, for example. The semiconductor memory device 20 includes plural memory cells and stores data in a nonvolatile manner.

The NAND bus transmits and receives signals such as "CE," "CLE," "ALE," "/WE," "/RE," "/WP," "/RB," and "I/O<7:0>" according to a NAND interface via individual signal lines, respectively. The signal /CE is a signal for enabling the semiconductor memory device 20. The signal CLE notifies the semiconductor memory device 20 that the signal I/O<7:0> which flows in the semiconductor memory device 20 while the signal CLE is at a "high (H)" level is a command. The signal ALE notifies the semiconductor memory device 20 that the signal I/O<7:0> which flows in the semiconductor memory device 20 while the signal ALE is at the "H" level is an address. The signal /WE instructs the semiconductor memory device 20 to take in the signal I/O<7:0> which flows in the semiconductor memory device 20 while the signal /WE is at a "low (L)" level. The signal /RE instructs the semiconductor memory device 20 to output the signal I/O<7:0>. The signal /WP instructs the semiconductor memory device 20 to prevent data from being written and erased. The signal /RB indicates whether the semiconductor memory device 20 is in a ready state (a state of being able to receive a command from an external device) or a busy state (a state of not being able to receive a command from an external device). The signal I/O<7:0> is, for example, an 8-bit signal. The signal I/O<7:0> is, for example, at least a portion of data transmitted and received between the semiconductor memory device 20 and the controller 10 and includes a command CMD, an address ADD, and data DAT. The data DAT includes write data and read data.

1.1.2 Configuration of Controller

Subsequently, a controller of the memory system according to the first aspect will be described with reference to FIG. 1. The controller 10 includes a processor (central processing unit (CPU)) 11, a memory (random access memory (RAM)) 12, an error check and correction (ECC) circuit 13, a NAND interface circuit 14, a buffer memory 15, and a host interface circuit 16.

The processor 11 controls the overall operation of the controller 10. The processor 11 issues a read command based on the NAND interface to the semiconductor memory device 20, for example, in response to a read command of the data received from the host device. Such an operation is similarly applied to cases of writing and erasing. Further, the processor 11 has a function of executing various operations on the read data from the semiconductor memory device 20.

The memory 12 is a semiconductor memory such as a static RAM (SRAM) or a dynamic RAM (DRAM), and is used as a work area of the processor 11. The memory 12 stores firmware and various management tables for managing the semiconductor memory device 20. The memory 12 may be embedded in the controller 10 or mounted external to the controller 10.

The ECC circuit 13 performs error detection and error correction processing of the data stored in the semiconductor memory device 20. That is, when data is written, the ECC circuit 13 generates an error correction code and assigns the generated error correction code to the written data. Further, when data is read, the ECC circuit 13 decodes the data based on the ECC code and detects the presence or absence of an error. In addition, when an error is detected, the ECC circuit 13 specifies a bit position of the error and corrects the error. An error correction method includes, for example, hard bit decoding and soft bit decoding. For example, a Bose-Chaudhuri-Hocquenghem (BCH) code or a Reed-Solomon (RS) code may be used as a hard bit decoding code used for the hard bit decoding, and for example, a low density parity check (LDPC) code or the like may be used as a soft bit decoding code used for the soft bit decoding.

The NAND interface circuit 14 is electrically connected to the semiconductor memory device 20 via the NAND bus to manage communication with the semiconductor memory device 20. The NAND interface circuit 14 transmits the command CMD, the address ADD, and the write data DAT to the semiconductor memory device 20 according to the instruction of the processor 11. Further, the NAND interface circuit 14 receives the read data DAT from the semiconductor memory device 20.

The buffer memory 15 temporarily holds data and the like that the controller 10 receives from the semiconductor memory device 20 and the host device. The buffer memory 15 is also used as, for example, a memory area for temporarily holding the read data from the semiconductor memory device 20 and an operation result for the read data.

The host interface circuit 16 is electrically connected to the host device to manage communication with the host device. The host interface circuit 16 transmits, for example, the command and the data received from the host device to the processor 11 and the buffer memory 15, respectively.

1.1.3 Configuration of Semiconductor Memory Device

Figure 2:
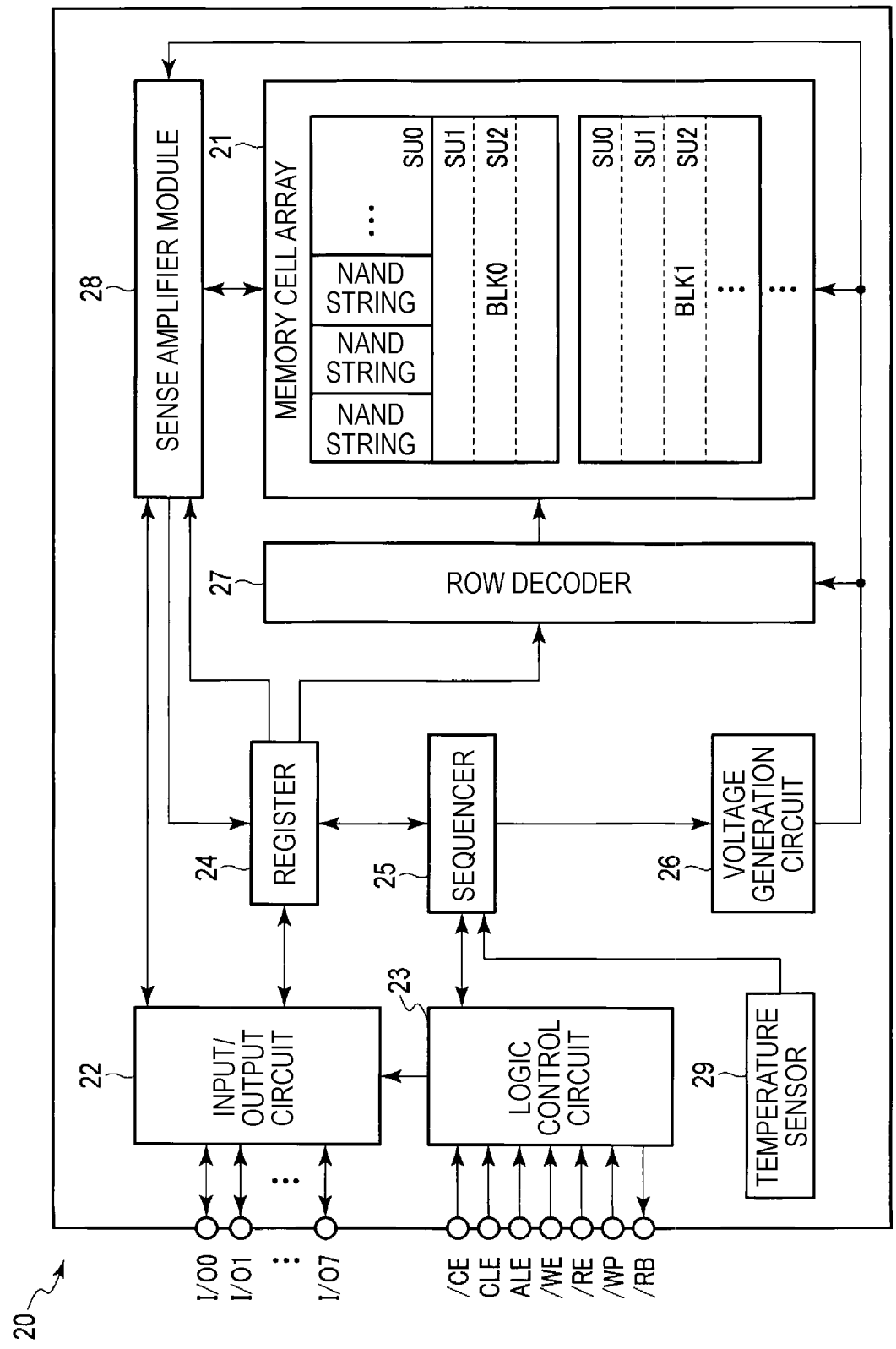
FIG. 2 is a block diagram for describing the configuration of one or more embodiments of a semiconductor memory device according to the first aspect.

Subsequently, the configuration example of the semiconductor memory device according to the first aspect will be described with reference to FIG. 2. FIG. 2 is a block diagram illustrating an example of a configuration of a semiconductor memory device according to the first aspect.

The semiconductor memory device 20 includes a memory cell array 21, an input/output circuit 22, a logic control circuit 23, a register 24, a sequencer 25, a voltage generation circuit 26, a row decoder 27, a sense amplifier module 28, and a temperature sensor 29.

The memory cell array 21 includes plural blocks BLK (BLK0, BLK1, ... ). The blocks BLK include plural non-volatile memory cell transistors (not illustrated) associated with word lines and bit lines. A block BLK is, for example, an erase unit of data, and the data in the same block BLK is collectively erased. Each block BLK includes plural string units SU (SU0, SU1, SU2, ... ). Each string unit SU is a set of NAND strings NS. The NAND string NS includes plural memory cell transistors. Further, the number of blocks in the memory cell array 21, the number of string units in one block BLK, and the number of NAND strings in one string unit SU may be arbitrarily set.

The input/output circuit 22 transmits or receives signals I/O (I/O0 to I/O7) to or from the controller 10. The input/output circuit 22 transmits commands CMD and addresses ADD in the signals I/O to the register 24. The input/output circuit 22 transmits or receives the write data and the read data to or from the sense amplifier module 28.

The logic control circuit 23 receives the signals /CE, CLE, ALE, /WE, /RE, and /WP from the controller 10. Further, the logic control circuit 23 transmits the signal /RB to the controller 10 so as to notify an external device of a state of the semiconductor memory device 20.

The register 24 holds the command CMD and the address ADD. The register 24 transmits the addresses ADD to the row decoder 27 and the sense amplifier module 28, and transmits the commands CMD to the sequencer 25.

The sequencer 25 receives the commands CMD, and controls the entire semiconductor memory device 20 according to a sequence based on the received commands CMD. Further, the sequencer 25 receives temperature information from the temperature sensor 29. The sequencer 25 determines, for example, a value of a voltage to be generated during operations such as writing and reading of data, based on the command CMD and the temperature information.

The voltage generation circuit 26 generates a voltage required for the operations such as writing, reading, and erasing of data based on an instruction from the sequencer 25. The voltage generation circuit 26 includes a driver that supplies the generated voltage to the row decoder 27 and the sense amplifier module 28.

The row decoder 27 receives a row address among the addresses ADD from the register 24 and selects the block BLK based on the row address. In addition, the voltage from the voltage generation circuit 26 is transmitted to the selected block BLK via the row decoder 27.

When data is read, the sense amplifier module 28 senses the read data read from the memory cell transistor to the bit line, and transmits the sensed read data to the input/output circuit 22. When data is written, the sense amplifier module 28 transmits write data written through the bit line to the memory cell transistor. Further, the sense amplifier module 28 receives a column address among the addresses ADD from the register 24 and outputs data of a column based on the column address.

The temperature sensor 29 includes a temperature detection element that detects the temperature of the semiconductor memory device 20. The temperature sensor 29 generates, for example, temperature information corresponding to the temperature detected by the temperature detection element, and transmits the generated temperate information to the sequencer 25. The temperature information is used, for example, for correcting the voltage generated by the voltage generating circuit 26 in the writing operation or the reading operation. The temperature information may be information indicating the temperature or a change in temperature, information indicating a voltage value or a change in voltage value, or information generated from the information indicating the temperature and intermediate information used for determining the voltage value.

1.1.4 Configuration of Memory Cell Array

Figure 3:
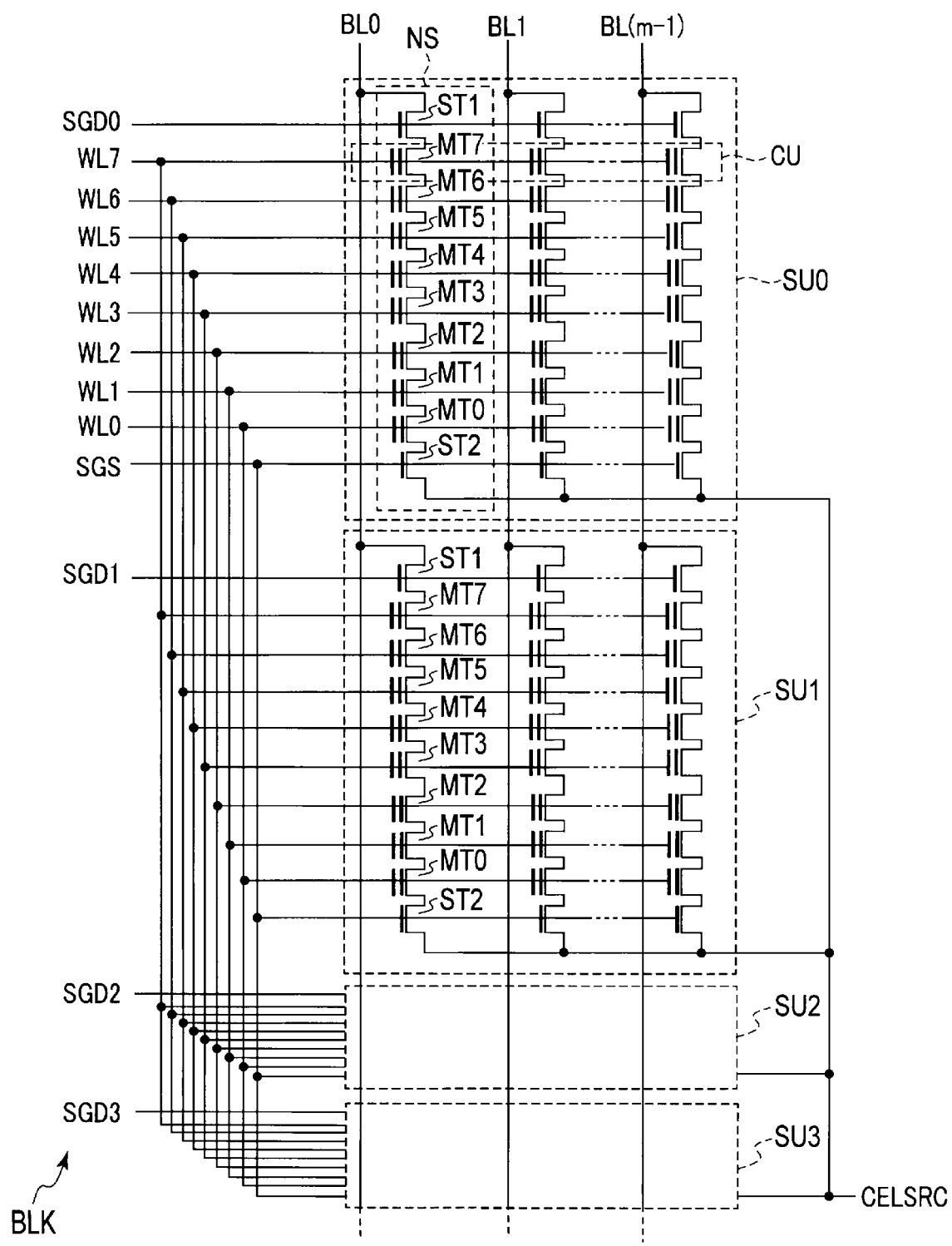
FIG. 3 is a circuit diagram for describing the configuration of a memory cell array of one or more embodiments of the semiconductor memory device according to the first aspect.

Subsequently, the configuration of the memory cell array of the semiconductor memory device according to the first aspect will be described with reference to FIG. 3. FIG. 3 illustrates an example of a circuit diagram for describing the configuration of the memory cell array of one or more embodiments of the semiconductor memory device according to the first aspect.

As illustrated in FIG. 3, each of the NAND strings NS includes, for example, eight memory cell transistors MT: MT0, MT1, MT2, MT3, MT4, MT5, MT6, MT7 (MT0 to MT7), a selection transistor ST1, and a selection transistor ST2. Further, the number of memory cell transistors MT is not limited to eight, and may be 16, 32, 64, 128, for example, but is not limited to these numbers. A memory cell transistor MT includes a stacked gate including a control gate and a charge storage layer. Each memory cell transistor MT is electrically connected in series between the selection transistors ST1 and ST2. In the present disclosure, the term "electrically connected" is used to refer to configurations in which two conductive components are in contact with each other, as well as configurations in which another conductive component is interposed between the two conductive components.

In a certain block BLK, the gates of the selection transistors ST1 of the string units SU0, SU1, SU2, and SU3 (SU0 to SU3) are electrically connected to selection gate lines SGD0, SGD1, SGD2, and SGD3 (SGD0 to SGD3), respectively. Further, the gates of the selection transistors ST2 of all the string units SU in the block BLK are commonly electrically connected to a selection gate line SGS. The control gates of the memory cell transistors MT0 to MT7 in the same block BLK are electrically connected to the word lines WL0, WL1, WL2, WL3, WL4, WL5, WL6, WL7 (WL0 to WL7), respectively. That is, word lines WL having the same address are commonly electrically connected to the string units SU in the same block BLK (e.g. all of the string units SU in the same block BLK), and the selection gate line SGS is commonly electrically connected to the string units SU in the same block BLK (e.g. all of the string units SU in the same block BLK). Meanwhile, the selection gate lines SGD are electrically connected to one of the string units SU (e.g. only one of the string units SU) in the same block BLK.

Among the NAND strings NS arranged in a matrix form in the memory cell array 21, the other end of the selection transistor ST1 of the NAND string NS in the same row is electrically connected to any of the m bit lines BL (BL0 to BL (m−1) (m is a natural number of 2 or more)). In addition, the bit lines BL are commonly electrically connected to the NAND strings NS of the same column across the plural blocks BLK.

In addition, the other end of the selection transistor ST2 is electrically connected to a source line CELSRC. The source line CELSRC is commonly electrically connected to the plural NAND strings NS across the plural blocks BLK.

As described above, data erasing is collectively performed for the memory cell transistors MT in the same block BLK, for example. In this regard, data reading and data writing may be collectively performed for the plural memory cell transistors MT commonly electrically connected to any one word line WL in any one string unit SU of any one block BLK. A set of memory cell transistors MT sharing the word line WL in one string unit SU is referred to as, for example, a cell unit CU. That is, the cell unit CU is a set of memory cell transistors MT in which writing or reading operation is collectively performed. The cell unit CU includes, for example, one or plural sets of memory areas, and the writing or reading operation for one cell unit CU is executed for one set of memory areas. A unit of such a memory area is referred to as a 'page'.

Figure 4:
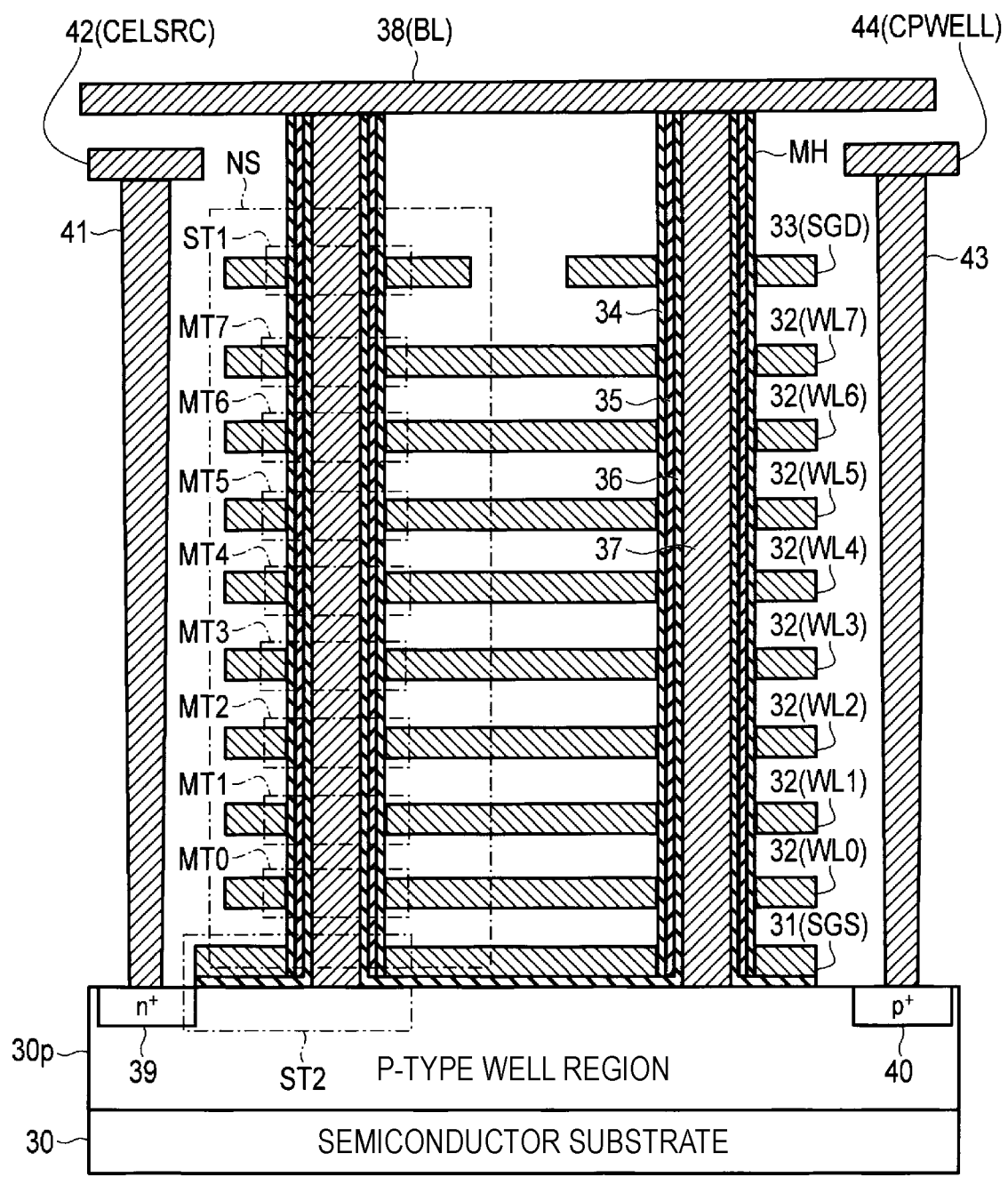
FIG. 4 is a cross-sectional view for describing the configuration of the memory cell array of one or more embodiments of the semiconductor memory device according to the first aspect.

Subsequently, a cross-sectional structure of the memory cell array 21 will be described with reference to FIG. 4. FIG. 4 illustrates an example of a cross-sectional structure of a part of the memory cell array of the semiconductor memory device according to the first aspect. FIG. 4 illustrates two NAND strings NS of each of two string units SU in one block BLK and peripheral parts thereof. In addition, the configuration of NAND strings NS illustrated in FIG. 4 is arranged in a plural number in an X direction (in accordance with the coordinate system shown in FIG. 4), and for example, the set of plural NAND strings NS aligned along the X direction corresponds to one string unit SU.

The semiconductor memory device 20 is provided on a semiconductor substrate 30. In the following description, a plane parallel to the surface of the semiconductor substrate 30 is defined as an XY plane, and a direction orthogonal to the XY plane is defined as a Z direction. Further, the X direction and the Y direction are assumed to be orthogonal to each other.

A p-type well region 30p is formed on the top of the semiconductor substrate 30. The plural NAND strings NS are installed on the p-type well region 30p. That is, on the p-type well region 30p, for example, a wiring layer 31 serving as the selection gate line SGS, eight wiring layers 32 (WL0 to WL7) serving as word lines WL0 to WL7, and a wiring layer 33 serving as the selection gate line SGD are sequentially stacked. The wiring layer 31 and the wiring layer 33 may be stacked in a plural number. An insulating film (not illustrated) is provided between each two adjacent stacked wiring layers 31 to 33.

The wiring layer 31 is commonly electrically connected to the gates of the respective selection transistors ST2 of the plural NAND strings NS in one block BLK, for example. The wiring layers 32 are commonly electrically connected to control gates of the respective memory cell transistors MT of the plural NAND strings NS in one block BLK for each layer. The wiring layer 33 is commonly electrically connected to the gates of the respective selection transistors ST1 of the plural NAND strings NS in one string unit SU.

A memory hole MH is formed to pass through the wiring layers 33, 32, and 31 and reach the p-type well region 30p. On a side surface of the memory hole MH (a surface defining the memory hole MH), a block insulating film 34, a charge storage layer (insulating film) 35, and a tunnel oxide film 36 are sequentially provided. A semiconductor pillar (conductive film) 37 is buried in, or disposed in, the memory hole MH. The semiconductor pillar 37 is, for example, non-doped polysilicon and serves as a current path for the NAND string NS. A wiring layer 38 serving as a bit line BL is provided on the upper end of the semiconductor pillar 37.

As described above, the selection transistor ST2, the plural memory cell transistors MT, and the selection transistor ST1 are sequentially stacked above the p-type well region 30p, and one memory hole MH corresponds to one NAND string NS.

An n$^+$-type impurity diffusion region 39 and a p$^+$-type impurity diffusion region 40 are provided in the upper portion of the p-type well region 30p. A contact plug 41 is provided on the upper surface of the n$^+$-type impurity diffusion region 39. A wiring layer 42 serving as the source line CELSRC is provided on the upper surface of the contact plug 41. A contact plug 43 is provided on the upper surface of the p$^+$-type impurity diffusion region 40. A wiring layer 44 serving as a well line CPWELL is provided on the upper surface of the contact plug 43.

Meanwhile, the memory cell array 21 may have other configurations. A configuration of the memory cell array 21 is disclosed in, for example, U.S. patent application Ser. No. 12/407,403 entitled "Three-dimensional stacked non-volatile semiconductor memory" and filed on Mar. 19, 2009. Further, other configurations of the memory cell array 21 are disclosed in U.S. patent application Ser. No. 12/406,524, entitled "Three-Dimensional Stacked Non-volatile Semiconductor Memory" and filed on Mar. 18, 2009, U.S. patent application Ser. No. 12/679,991 entitled "Nonvolatile Semiconductor Memory Device and Manufacturing Method Thereof" and filed on Mar. 25, 2010, and U.S. patent application Ser. No. 12/532,030 entitled "Semiconductor Memory and Method of Manufacturing The Same" and filed on Mar. 23, 2009. These patent applications are incorporated herein by reference in their entireties.

1.1.5 Threshold Voltage Distribution of Memory Cell Transistor

Figure 5:
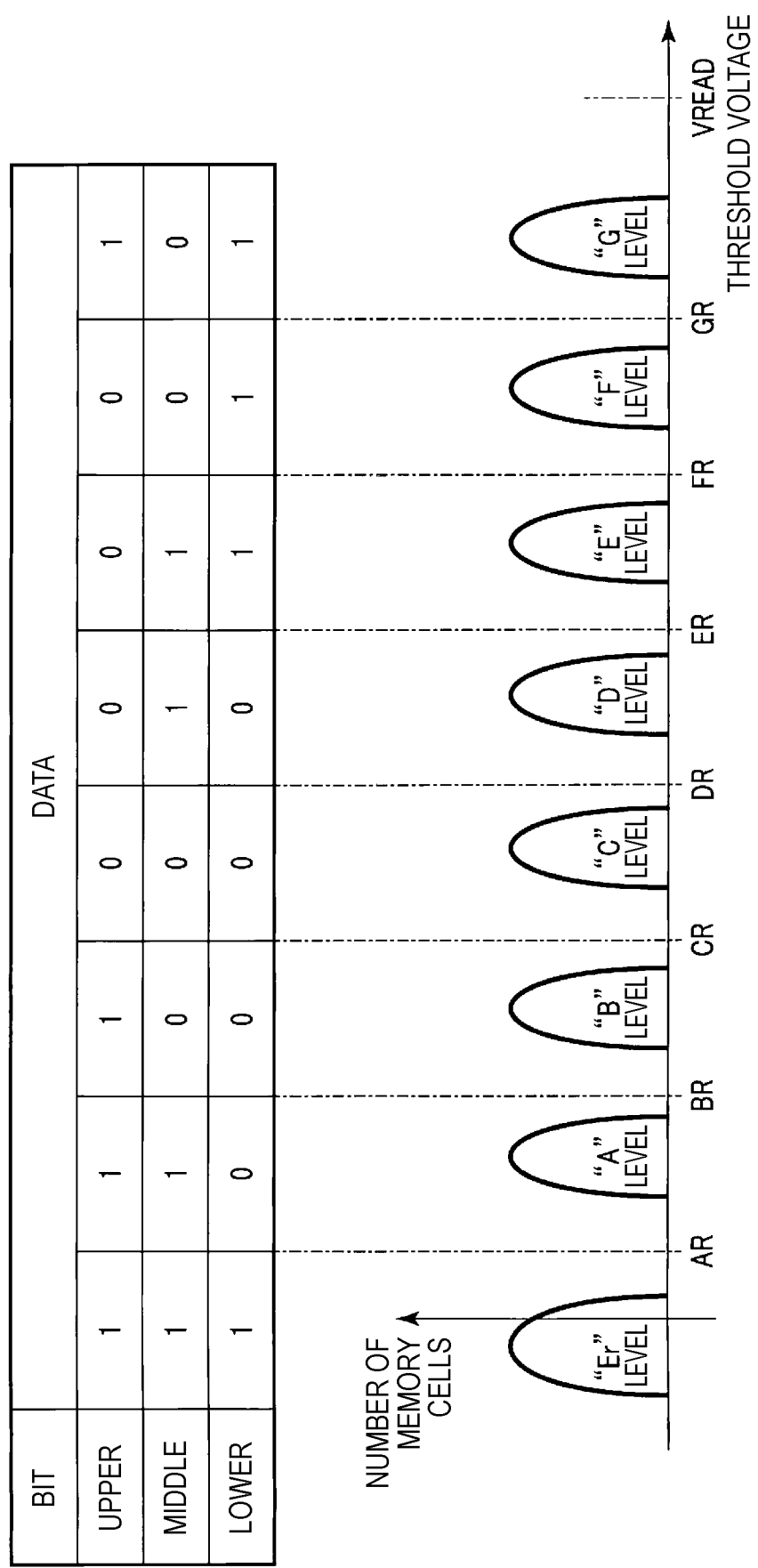
FIG. 5 is a schematic view for describing a threshold voltage distribution of a memory cell transistor of one or more embodiments of the semiconductor memory device according to the first aspect.

Next, a threshold voltage distribution, which may be assumed by a memory cell transistor MT will be described with reference to FIG. 5. FIG. 5 is a schematic view for describing an example of a threshold voltage distribution of a memory cell transistor of the semiconductor memory device according to the first aspect. In FIG. 5, an example of a case where 3-bit data is stored in one memory cell transistor MT (triple level cell (TLC)) is illustrated.

As illustrated in FIG. 5, the threshold voltage of a memory cell transistor MT may hold 3-bit data based on an upper bit (upper data), a middle bit (middle data), and a lower bit (lower data), that is, "111", "110", "100", "000", "010", "011", "001", or "101" data.

The threshold voltage distribution of the "111" data is at an "Er" level, which corresponds to, for example, a data erase state. In addition, the threshold voltages included in the "Er" level is smaller than a read voltage AR and has a positive or negative value.

The threshold voltage distributions of "110", "100", "000", "010", "011", "001", and "101" data are at "A", "B", "C", "D", "E", "F", and "G" levels, respectively. The "A" level to "G" level correspond to a state where charges are injected into the charge storage layer 35 and data is written in the memory cell transistor MT, and the threshold voltage included in each distribution has, for example, a positive value. The threshold voltages included in the "A" level are larger than the read voltage AR and further, smaller than a read voltage BR. The threshold voltages included in the "B" level are larger than the read voltage BR and further, smaller than read voltage CR. The threshold voltages included in the "C" level are larger than the read voltage CR and further, smaller than read voltage DR. The threshold voltages included in the "D" level are larger than the read voltage DR and further, smaller than read voltage ER. The threshold voltages included in the "E" level are larger than the read voltage ER and further, smaller than read voltage FR. The threshold voltages included in the "F" level are larger than the read voltage FR and further, smaller than read voltage GR. In addition, the threshold voltages included in the "G" level are larger than the read voltage GR and further, smaller than voltage VREAD. The voltage VREAD is a voltage applied to a word line WL that is not a reading target when data is written in a certain block BLK.

As described above, each memory cell transistor MT may be in any one of eight threshold voltage distributions, so that each memory cell transistor MT may assume any of eight states. Further, a relationship between each piece of data and a threshold level is not limited to the above relationships, but may be appropriately changed.

As described above, data writing and data reading are performed in units of pages in one cell unit CU. In the example shown in FIG. 5, the data is written and read for every lower bit, every middle bit, or every upper bit. Therefore, when a memory cell transistor MT holds 3-bit data, data corresponding to the upper bit, the middle bit, and the lower bit are respectively allocated to three pages in one cell unit CU. In the following description, pages that are collectively written or read for the upper bit, the middle bit, and the lower bit will be referred to as an upper page, a middle page, and a lower page, respectively.

The aforementioned read voltages AR to GR are each determined by a respective "standard value" and a respective "compensation value" that may be aggregated with the standard value to determine each of the read voltages AR to GR. The standard value is appropriately determined according to, for example, a reading method. The reading method includes, for example, normal reading, shift reading, and single level reading. The normal reading is a basic reading method and the read voltage in the normal reading can serve as the reference of the read voltage of the shift reading. In the shift reading, a shift amount for the standard value is set based on the standard value of the read voltage in the normal reading. In the single level reading, the standard value of independent read voltage may be set apart from the normal reading.

For the compensation value, a value determined based on various parameters may be applied. The compensation value may be an aggregation of values including, for example, a temperature compensation value determined based on the temperature.

1.1.6 Temperature Compensation Value

Subsequently, the temperature compensation value of the semiconductor memory device according to the first exemplary embodiment will be described with reference to FIG. 6. FIG. 6 illustrates an example of a table for describing a temperature compensation value of read voltage of the semiconductor memory device according to the first aspect.

As illustrated in FIG. 6, the sequencer 25 applies a temperature compensation value dV to the standard value to set the read voltages AR to GR according to the temperature in the semiconductor memory device 20 when the reading operation is executed. The temperature T is, for example, a temperature detected by the temperature sensor 29. The temperature T may be calculated based on the temperature detected by the temperature sensor 29, for example. The temperature compensation value dV to be applied may correspond to the temperature T as shown in the table shown in FIG. 6.

In the example shown in FIG. 6, when the temperature T is 85° C. or more and less than 110° C. (85° C.≤T<110° C.), the temperature compensation value dV is set to 0 V. That is, the read voltages AR to GR are not corrected from the standard value. When the temperature T is 60° C. or more and less than 85° C. (60° C.≤T<85° C.), the temperature compensation value dV is set to about 0.05 V. That is, the read voltages AR to GR are corrected to be a value larger than the standard value by about +0.05 V. When the temperature T is 35° C. or more and less than 60° C. (35° C.≤T<60° C.), the temperature compensation value dV is set to about 0.10 V. That is, the read voltages AR to GR are corrected to be a value larger than the standard value by about +0.10 V. When the temperature T is 10° C. or more and less than 35° C. (10° C.≤T<35° C.), the temperature compensation value dV is set to about 0.15 V. That is, the read voltages AR to GR are corrected to be a value larger than the standard value by about +0.15 V.

With the above configuration, the sequencer 25 may allow the voltage generation circuit 26 to generate optimum read voltages AR to GR while considering an influence of a characteristic of the memory cell transistor MT which varies according to the temperature when data is read.

The temperature compensation value dV is not limited to those shown in FIG. 6, and a value (e.g. a predetermined value) may be set according to the temperature. In addition, FIG. 6 illustrates a case where the temperature compensation value dV is determined based only on the temperature T is described, but the embodiments disclosed herein are not limited thereto. For example, the temperature compensation value dV may be determined based on the temperature T and parameters other than the temperature T.

In FIG. 6, although the relationship between a difference of the respective standard values of the read voltages AR to GR and the temperature compensation value dV is not explicitly illustrated, the temperature compensation value dV may be applied to all of the read voltages AR to GR or only to some of the read voltages AR to GR. In addition, a common temperature compensation value dV may be applied to a set of the read voltages AR to GR (e.g. to each of the read voltages AR to GR), or different temperature compensation values dV may be applied to the respective read voltages AR to GR.

In FIG. 6, the temperature compensation value dV for the voltage applied in the reading operation is described, but is not limited thereto. For example, the sequencer 25 may apply the temperature compensation value dV based on the temperature T to the voltage applied not only in the reading operation but also in the writing operation. Further, the temperature compensation value dV applied in the writing operation may be different from that applied in the reading operation.

1.2 Operation

Subsequently, one or more operations of embodiments of the semiconductor memory device according to the first aspect will be described.

1.2.1 Lock/Unlock Operation

First, a lock/unlock operation in the semiconductor memory device according to the first aspect will be described.

The lock/unlock operation is an operation related to a function of correcting a voltage applied to a word line WL during the writing operation or reading operation in the semiconductor memory device 20. The lock/unlock operation includes a lock operation and an unlock operation. The temperature compensation value dV determined in the lock operation and to be applied in the operation after the lock operation is fixed irrespective of the variation of the value of the temperature T after the lock operation. The temperature compensation value dV determined in the unlock operation and to be applied in the operation after the unlock operation is determined according to the variation of the value of the temperature T after the unlock operation. The unlock operation may resume updating of the temperature compensation value dV locked by the lock operation.

Figure 7:
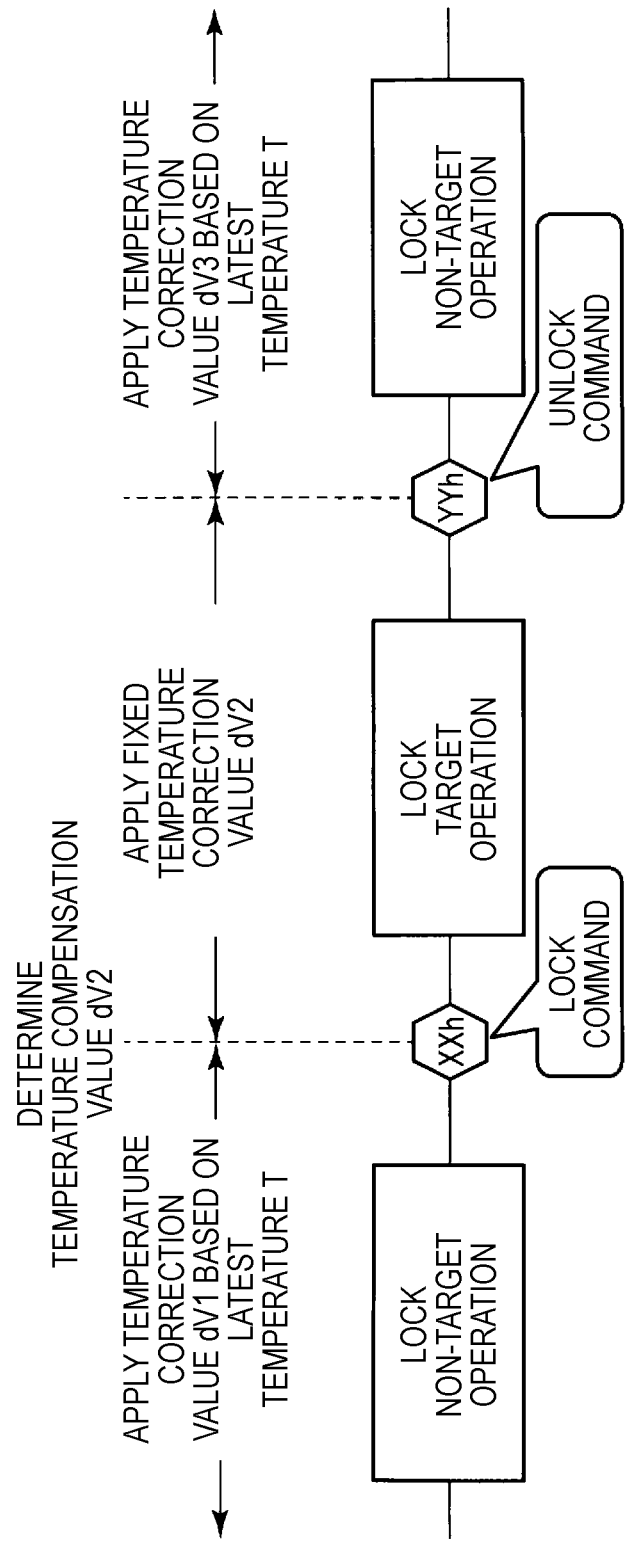
FIG. 7 is a command sequence for describing one or more embodiments of a lock/unlock operation of the semiconductor memory device according to the first aspect.

FIG. 7 is an example command sequence for describing the lock/unlock operation of the semiconductor memory device according to the first aspect.

As illustrated in FIG. 7, the controller 10 instructs the semiconductor memory device 20 to perform a lock non-target operation. Upon receiving the instruction of the lock non-target operation, the sequencer 25 receives the temperature information corresponding to the temperature T from the temperature sensor 29. Based on the temperature information, the sequencer 25 determines a temperature compensation value dV1 of the voltage applied to the word line WL in the lock non-target operation. Then, the sequencer 25 controls the voltage generation circuit 26, the row decoder 27, and/or the sense amplifier module 28, based on the voltage to which the temperature compensation value dV1 is applied and executes the lock non-target operation.

Subsequently, the controller 10 issues a lock command "XXh". The lock command "XXh" is a command for declaring that the updating of the temperature compensation value dV is to be stopped (locked). Upon receiving the lock command "XXh", the sequencer 25 may receive the temperature information from the temperature sensor 29. Based on the temperature information, the sequencer 25 determines and fixes (locks) the temperature compensation value dV2 of the voltage applied to the word line WL in a subsequent operation. After fixing the temperature compensation value dV to a temperature compensation value dV2, the sequencer 25 does not update the temperature compensation value dV based on temperature information newly received from the temperature sensor 29.

Subsequently, the controller 10 instructs the semiconductor memory device 20 to perform a lock target operation. Upon receiving the instruction of the lock target operation, the sequencer 25 controls the voltage generation circuit 26, the row decoder 27, and/or the sense amplifier module 28, based on the voltage to which the fixed temperature compensation value dV2 is applied and executes the lock target operation.

The sequencer 25 may omit (e.g. may temporarily omit) determining the temperature compensation value dV2 immediately after receiving the lock command "XXh". In such a case, the sequencer 25 may receive the temperature information from the temperature sensor 29 and determine the temperature compensation value dV2 during a first lock target operation after receiving the lock command "XXh".

Subsequently, the controller 10 issues an unlock command "YYh". The unlock command "YYh" is a command for declaring that the lock of the updating of the temperature information for correcting the voltage applied a word line WL is released (unlocked). That is, upon receiving the unlock command "YYh", the sequencer 25 resumes the updating of the temperature compensation value dV based on the temperature information from the temperature sensor 29.

Subsequently, the controller 10 instructs the semiconductor memory device 20 to perform the lock non-target operation. Upon receiving the instruction of the lock non-target operation, the sequencer 25 receives the temperature information corresponding to the temperature T from the temperature sensor 29. Based on the temperature information, the sequencer 25 determines a temperature compensation value dV3 of the voltage applied to the word line WL in the lock non-target operation. Then, the sequencer 25 controls the voltage generation circuit 26, the row decoder 27, and/or the sense amplifier module 28, based on the voltage to which the temperature compensation value dV3 is applied and executes the lock non-target operation.

By such an operation, the fixed temperature compensation value dV2 is applied in the lock target operation instructed between the lock command "XXh" and the unlock command "YYh". In addition, the temperature compensation values dV1 and dV3 are applied in the lock non-target operations instructed before the lock command "XXh" is received and after the unlock command "YYh" is received, respectively.

1.2.2 Outline of Operation Accompanying Lock/Unlock Operation

Figure 8:
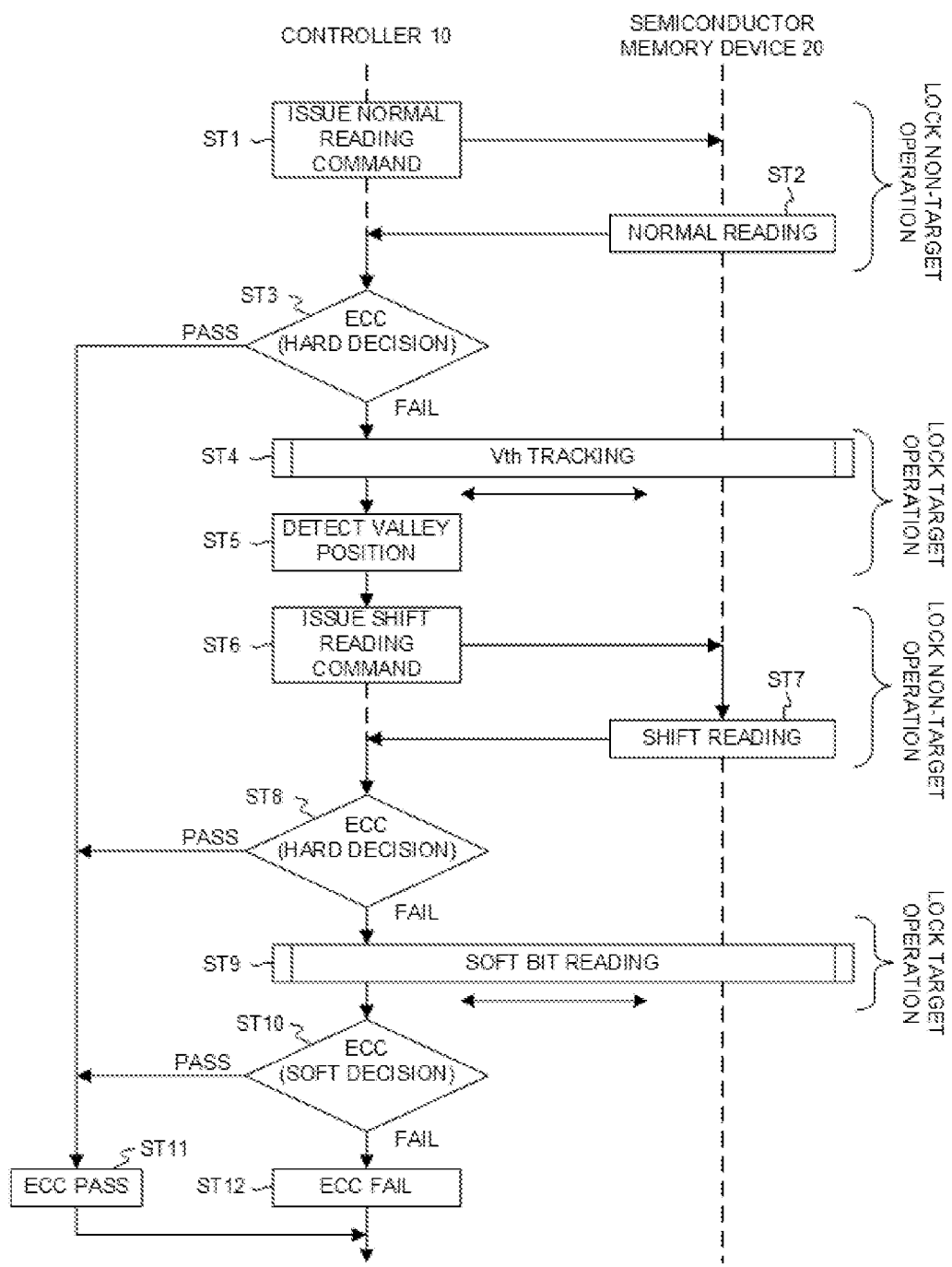
FIG. 8 is a flowchart for describing one or more embodiments of an operation of the memory system according to the first aspect.

Subsequently, an outline of an operation accompanying the lock/unlock operation in the semiconductor memory device according to the first aspect will be described. FIG. 8 is a flowchart for describing one or more embodiments of an operation of the memory system according to the first aspect.

As illustrated in FIG. 8, in operation ST1, the controller 10 issues a normal reading command to the semiconductor memory device 20.

In operation ST2, the semiconductor memory device executes normal reading to which the temperature compensation value dV is applied based on the latest temperature information. That is, the normal reading in operation ST2 is the lock non-target operation. The semiconductor memory device 20 transmits the read data to the controller 10.

In operation ST3, the ECC circuit 13 performs hard bit decoding on the basis of the read data of the normal reading and the hard bit decoding code. When the decoding of the read data of the normal reading is successful (operation ST3; pass), the controller 10 proceeds to operation ST11 and when the decoding is unsuccessful (operation ST3; fail), the controller 10 proceeds to operation ST4.

In operation ST4, the controller 10 and the semiconductor memory device 20 perform a Vth tracking operation. The Vth tracking operation is an operation for detecting a valley position of a threshold voltage distribution (e.g. a local minima or absolute minima) by estimating the threshold voltage distribution of a memory cell transistor MT group. In this case, the Vth tracking operation is executed as the lock target operation. Details of the Vth tracking operation will be described below.

In operation ST5, the controller 10 detects the valley position of the threshold voltage distribution of the memory cell transistor MT group based on a result of the Vth tracking operation.

In operation ST6, the controller 10 issues, to the semiconductor memory device 20, a shift reading command to apply the read voltage at the detected valley position as the standard value.

In operation ST7, the semiconductor memory device executes the shift reading adopting the temperature compensation value dV based on the latest temperature information. That is, the shift reading in operation ST7 is the lock non-target operation. The semiconductor memory device 20 transmits the read data to the controller 10.

In operation ST8, the ECC circuit 13 performs the hard bit decoding on the basis of the read data of the shift reading and the hard bit decoding code. When the decoding of the read data of the shift reading is successful (operation ST8; pass), the controller 10 proceeds to operation ST11 and when the decoding is unsuccessful (operation ST8; fail), the controller 10 proceeds to operation ST9.

In operation ST9, the controller 10 and the semiconductor memory device 20 perform a soft bit reading operation. The soft bit reading operation is an operation of transmitting, to the controller 10, the read data read through plural times of consecutive shift reading. In this case, the soft bit reading operation is executed as the lock target operation. The details of the soft bit reading operation will be described later.

In operation ST10, the ECC circuit 13 performs the soft bit decoding on the basis of the read data of the plural times of shift reading by the soft bit reading and the soft bit decoding code. When the decoding of the data based on the plural times of shift reading based on the soft bit reading is successful (operation ST10; pass), the controller 10 proceeds to operation ST11 and when the decoding is unsuccessful (operation ST10; fail), the controller 10 proceeds to operation ST12.

In operation ST11, the controller 10 acquires a status of an ECC pass and terminates the operation. In operation ST12, the controller 10 determines that the data may not be accurately corrected based on an ECC result and terminates the operation.

At this point, the operation of accompanying the lock/unlock operation is terminated.

In the normal reading in operation ST2 and the shift reading in operation ST7, a predetermined read voltage is applied to the memory cell transistor MT so as to determine whether the data written in the memory cell transistor MT is "1" or "0". In addition, in the hard bit decoding in operations ST3 and ST8, the result of the above determination is used for error correction processing.

Meanwhile, in the soft bit reading operation in operation ST9 described above, in addition to the predetermined read voltage applied when acquiring the data used in the hard bit decoding, plural readings are executed by additionally using plural reading voltages having different magnitudes from the predetermined read voltage. The plural read voltages different from the predetermined read voltage include a voltage higher than the predetermined read voltage and a voltage lower than the predetermined read voltage. In addition, in the soft bit decoding in operation ST10, the data acquired as a result of the plural readings is used for the error correction processing.

1.2.3 Vth Tracking Operation

Subsequently, the Vth tracking operation of the semiconductor memory device according to the first aspect will be described.

1.2.3.1 Outline of Vth Tracking Operation

An outline, or overview, of one or more embodiments of the Vth tracking operation according to the first aspect will be described.

In FIG. 5, as described above, the threshold voltage distributions of the respective data are independent from each other. Therefore, in the normal reading, when the standard values of the read voltages AR to GR are set within the threshold voltage distributions of the respective data, correct data may be read.

However, due to various factors, the threshold voltage of the memory cell transistor MT can fluctuate. As a result, in the threshold voltage distributions shown in FIG. 5, a distribution width may increase or the distribution may move, so that the adjacent distributions may overlap with each other. This state is illustrated in FIGS. 9A and 9B.

Figure 9A:
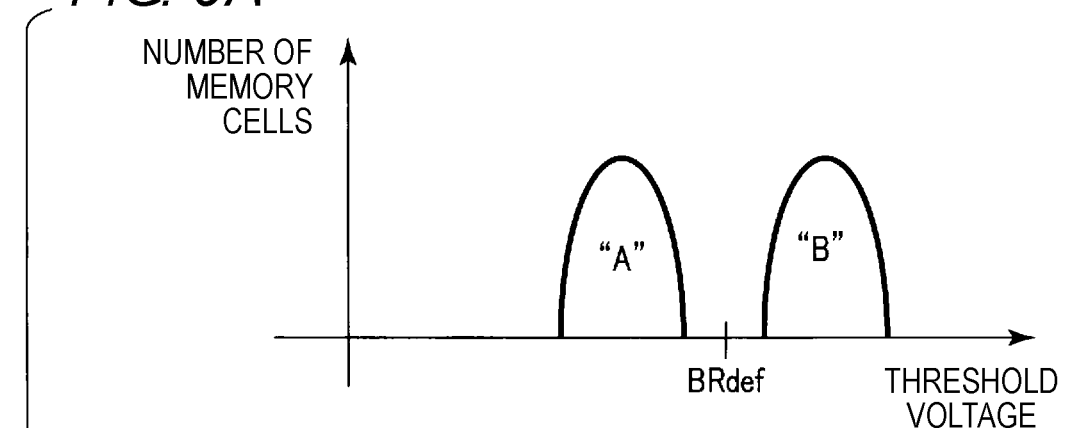
FIGS. 9A and 9B are schematic views for describing a variation in threshold voltage distribution of one or more embodiments of the semiconductor memory device according to the first aspect.
Figure 9B:
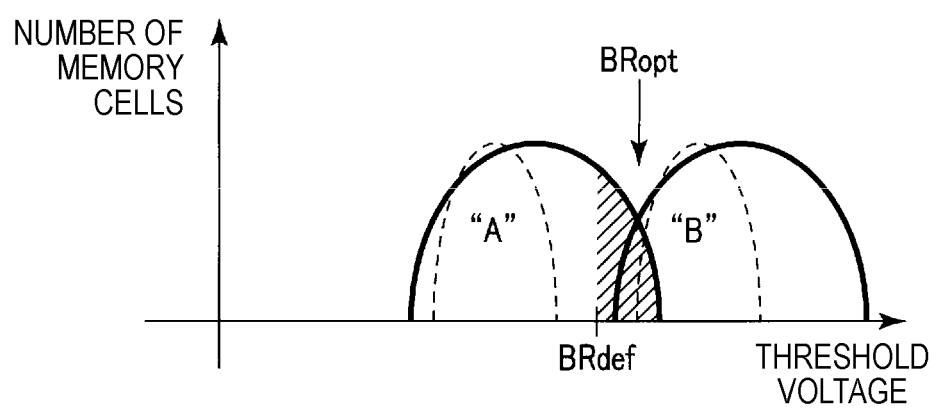

FIG. 9A and FIG. 9B are schematic views for describing a variation in threshold voltage distribution of one or more embodiments of the semiconductor memory device according to the first aspect. For example, it is assumed that the threshold voltage distributions of "A" level and "B" level are as illustrated in FIG. 9A immediately after writing. However, it is assumed that the threshold voltage distributions spread out as illustrated in FIG. 9B due to factors including disturbance and the like. Then, when reading is performed with an initially set read voltage BRdef, the read data of the memory cell transistor MT corresponding to an area of a hatched part becomes an error. When the number of error bits exceeds the number of error correctable bits of the ECC circuit 13, the data may not be sufficiently corrected.

In such a case, it may be advantageous to set a voltage at which overlapping of the threshold voltage distributions of two levels becomes small as a new read voltage so that the number of error bits is reduced. In order to minimize the number of error bits when data is read, shift reading can be performed in which a voltage (for example, a voltage BRopt in FIG. 9) at the valley position where the overlapping of the threshold voltage distributions of two levels is minimized (e.g. is at, or is in the vicinity of, a local minima) is set as the read voltage. The Vth tracking is an operation for detecting such a valley position.

FIG. 10A through FIG. 10C are schematic views for describing an outline of one or more embodiments of a Vth tracking operation of the semiconductor memory device according to the first aspect. FIG. 10A is a graph illustrating threshold voltage distributions of "A" level and "B" level as one example of the threshold voltage distribution of the memory cell transistor MT group. FIG. 10B is a graph illustrating a transition of the number (the number of on-cells) of memory cells to be turned on for a predetermined read voltage. FIG. 10C is a histogram illustrating a variation in the number of on-cells in a read voltage range. FIGS. 10B and 10C are obtained by plotting values to correspond to the memory cell transistor MT group having the threshold voltage distributions of FIG. 10A.

As illustrated in FIG. 10B, when the read voltage increases, the number of on-cells abruptly increases at a voltage slightly lower than a voltage VA which is a median value of the "A" level, and as a result, dM/dV becomes a maximum (e.g. is at a local maxima). Here, the median value is a voltage with the highest distribution probability of the threshold voltage in FIG. 10A, in which M represents the number of on-cells and V represents the read voltage to be applied to a selection word line WL. When the read voltage further increases, an increase rate of the number of on-cells decreases and becomes a minimum value (e.g. is at a local minima) at a certain value. The increase rate at the read voltage is about zero when the threshold voltage distribution of the "A" level and the threshold voltage distribution of the "B" level do not overlap with each other. Meanwhile, when both distributions overlap with each other, the corresponding increase rate becomes a predetermined non-zero minimum value (a value greater than 0). In addition, when the read voltage further increases, the increase rate of the number of on-cells increases again, and as a result, dM/dV becomes a maximum again (e.g. a local maxima) at a voltage slightly lower than the voltage VB which is a median value of the "B" level.

By a change in cumulative value of the number of on-cells, it is possible to detect the valley position between two levels, that is, the position of the read voltage at which the overlapping of the threshold voltage distributions of two levels is the smallest. For example, first, the reading operation is performed using a read voltage V1. The number of on-cells in this case is set to M1. Next, the reading operation is performed by using a voltage V2 which is higher than the voltage V1 by ΔV. The number of on-cells in this case is set to M2. Then, the number of memory cell transistors MT newly turned on when the read voltage applied to the selection word line WL rises from V1 to V2 is (M2−M1).

Next, the reading operation is performed by using a voltage V3 which is higher than the voltage V2 by ΔV. The number of on-cells in this case is set to M3. Then, the number of memory cell transistors MT newly turned on when the read voltage applied to the selection word line WL rises from V2 to V3 is (M3−M2). Then, assuming that (M2−M1)>(M3−M2), it is considered that the voltage at which dM/dV becomes the minimum is at least higher than the voltage V2.

Next, the reading operation is performed by using a voltage V4 which is higher than the voltage V3 by ΔV. Assuming that the number of on-cells in this case is set to M4 and (M3−M2)>(M4−M3), the histogram illustrated in FIG. 10C may be obtained.

As a result, it is possible to estimate the threshold voltage distribution as indicated by the alternate long and short dashed line in FIG. 10C by the variation of the number of on-cells and to estimate that the valley position between the "A" level and the "B" level is between the voltage V2 and the voltage V3.

The variation of the number of on-cells is extracted, for example, by tracking a state in which the number of bits (bit count) in the read data per page varies by changing the read voltage. These operations are collectively referred to as the Vth tracking operation.

1.2.3.2 Details of Vth Tracking Operation

Figure 11:
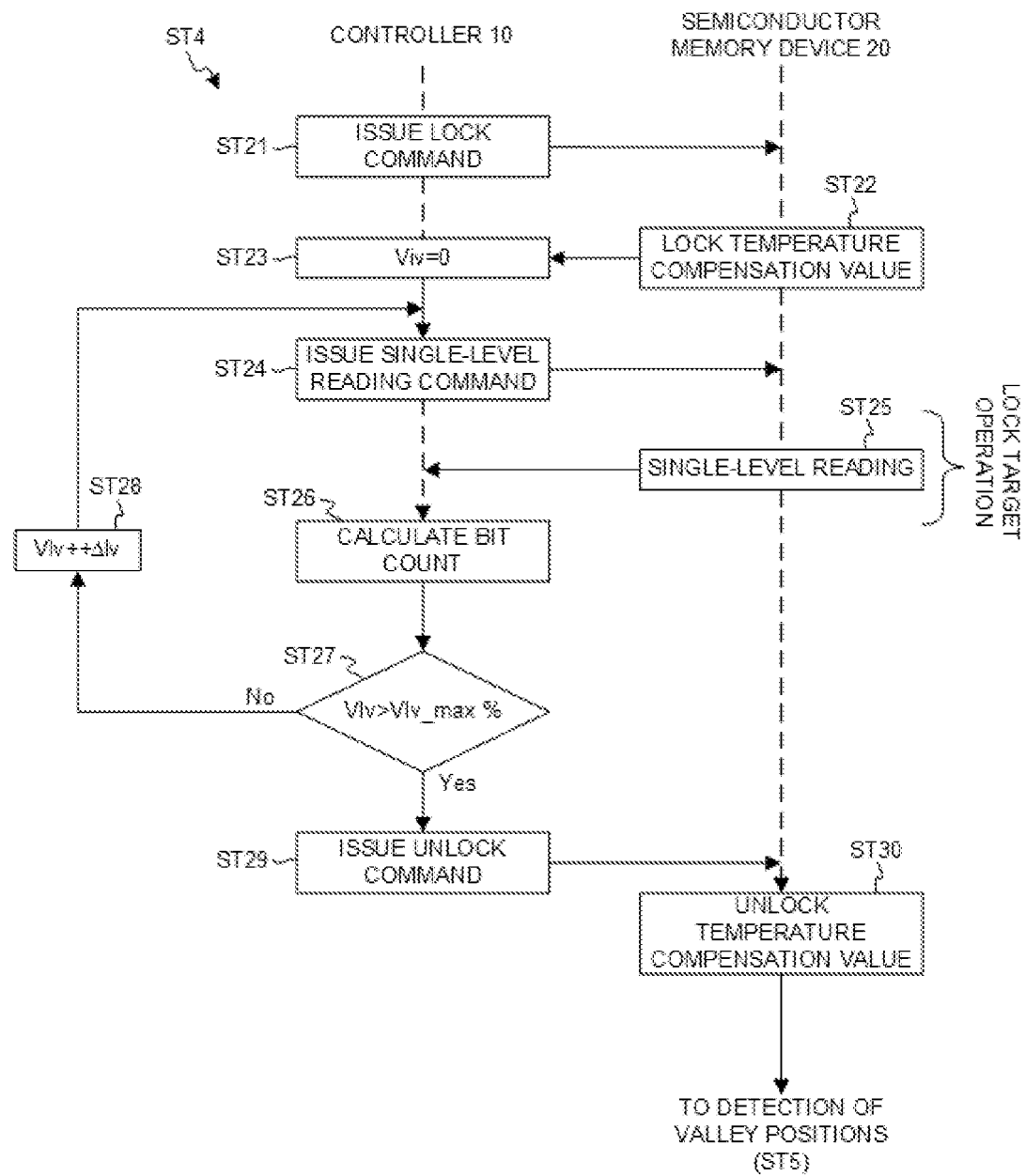
FIG. 11 is a flowchart for describing one or more embodiments of the Vth tracking operation of the memory system according to the first aspect.

Subsequently, details of one or more embodiments of the Vth tracking operation of the semiconductor memory device according to the first aspect will be described. FIG. 11 is a flowchart for describing the Vth tracking operation in the memory system according to the first aspect. Operations ST21 to ST30 illustrated in FIG. 11 can correspond to operation ST4 in FIG. 8.

As illustrated in FIG. 11, in operation ST21, the controller 10 issues a lock command "XXh".

In operation ST22, the semiconductor memory device 20 determines the temperature compensation value dV2 based on the latest temperature information and fixes the temperature compensation value applied in the subsequent operation to the temperature compensation value dV2.

In operation ST23, the controller 10 initializes loop processing executed in subsequent operations ST24 to ST28 (e.g. by setting Vlv=0 (Vlv represents a real number)). Here, the voltage Vlv is the standard value of the read voltage applied in a single-level reading.

In operation ST24, the controller 10 issues, to the semiconductor memory device 20, a single-level reading command to designate the voltage Vlv as the standard value of the read voltage.

In operation ST25, the semiconductor memory device 20 executes the single-level reading in which the temperature compensation value dV2 is applied to the standard value of the voltage Vlv. The semiconductor memory device 20 transmits the read data of the single-level reading to the controller 10.

In operation ST26, the controller 10 calculates the bit count based on the read data of the single-level reading.

In operation ST27, the controller 10 determines whether the loop processing is to be continued. Specifically, when the voltage Vlv is not higher than a voltage Vlv_max (or is lower than a voltage Vlv_max) (operation ST27; No), the process proceeds to operation ST28 to increment a voltage Δlv to the voltage Vlv and thereafter, returns to operation ST24. Further, when the voltage Vlv is higher than the voltage Vlv_max (operation ST27; Yes), the process proceeds to operation ST29.

In operation ST29, the controller 10 issues the unlock command "YYh".

In operation ST30, the semiconductor memory device 20 resumes the updating of the temperature compensation value dV.

As described above, the controller 10 detects the valley position (operation ST5 illustrated in FIG. 8) after completion of the calculation of the bit count in all single-level readings. As a result, the controller 10 may determine the read voltage of the read data at which a subsequent hard bit process (operation ST8 illustrated in FIG. 8) is executed.

Figure 12:
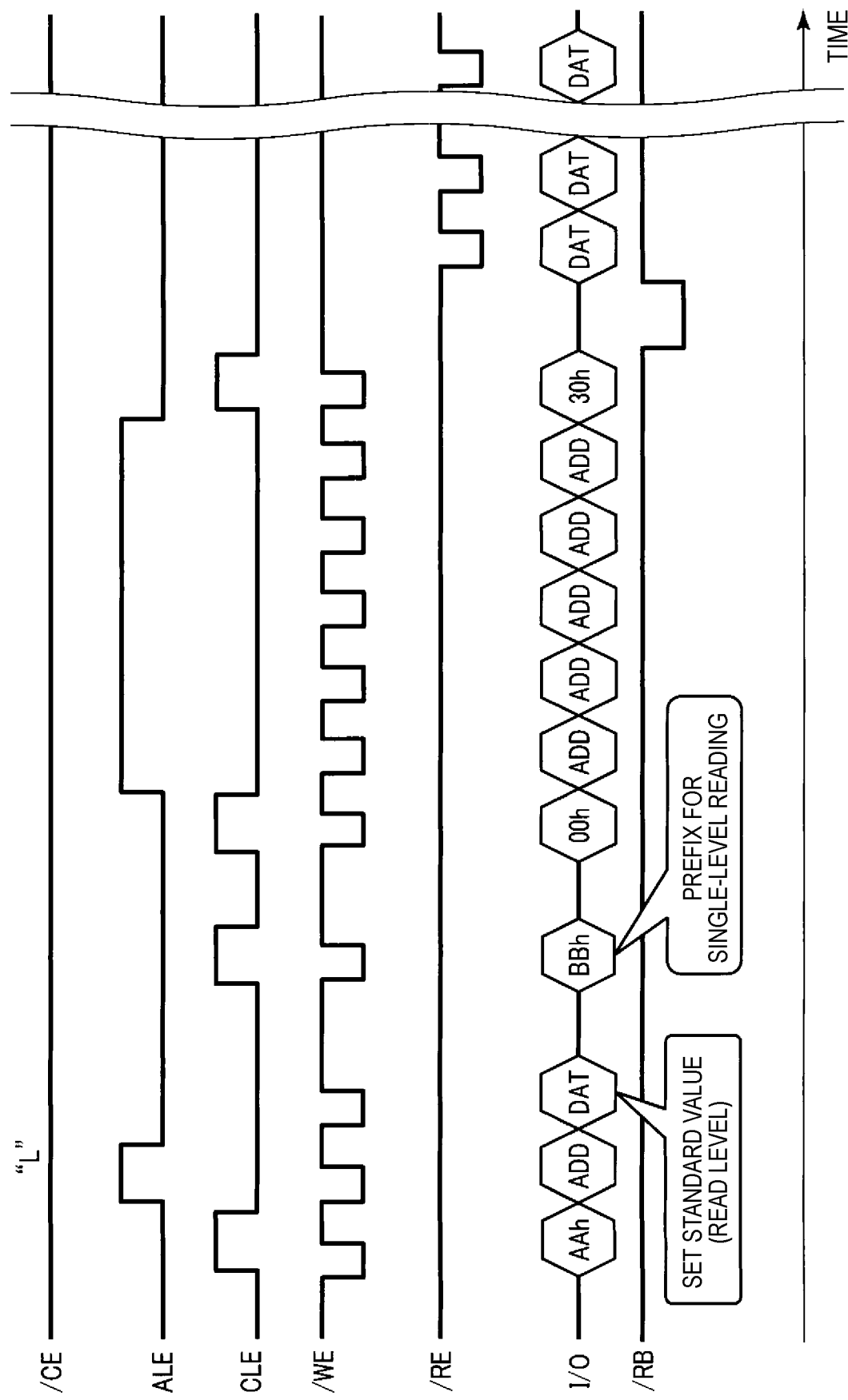
FIG. 12 is a command sequence for describing one or more embodiments of a single level reading operation of the semiconductor memory device according to the first aspect.

FIG. 12 is a command sequence for describing one or more embodiments of a single-level reading operation of the semiconductor memory device according to the first aspect. The command sequence illustrated in FIG. 12 corresponds to operation ST25 in FIG. 11.

As illustrated in FIG. 12, the controller 10 issues a command "AAh". The command "AAh" is a command for setting the single-level reading to be executed with respect to the semiconductor memory device 20. Subsequently, the controller 10 issues an address over, for example, one cycle. Thereafter, the controller 10 issues the data DAT over, for example, one cycle. The data DAT includes, for example, information corresponding to a standard value (Vlv+Δlv) of the read voltage in the single-level reading.

The controller 10 issues a prefix command "BBh". The command "BBh" is a command for declaring that the controller 10 performs the single-level reading with respect to the semiconductor memory device 20. Thereafter, the controller 10 issues a first read command "ooh" and subsequently issues addresses (including a column address, a block address, and a page address) over, for example, 5 cycles. Thereafter, the controller 10 issues a second read command "30h".

When the command "30h" is stored in the register 24, the sequencer 25 controls the voltage generation circuit 26, the row decoder 27, and/or the sense amplifier module 28, to start the reading operation. Further, the logic control circuit 23 sets the signal /RB at the "L" level so as to notify the controller 10 that the semiconductor memory device 20 is in a busy state. During the reading operation, data for one page is read from an area corresponding to the address transmitted from the controller 10. The logic control circuit 23 sets the signal /RB at the "H" level so as to notify the controller 10 that the semiconductor memory device 20 is in a ready state.

When the semiconductor memory device 20 is in the ready state, the controller 10 repeatedly asserts the signal /RE. Whenever the signal /RE is toggled, the data read from the memory cell array 21 is transmitted to the controller 10.

In the command sequence, when inputting the command to the semiconductor memory device 20, the controller 10 asserts the signal CLE, when inputting the address, the controller 10 asserts the signal ALE, and when inputting the data, the controller 10 negates the signals CLE and ALE when the data is input. In addition, when a predetermined signal is input to the semiconductor memory device 20, the controller 10 toggles the signal /WE.

By such an operation, plural instances of single-level reading repeatedly executed within the range of 0≤Vlv<Vlv_max in operations ST24 to ST28 constitute the lock target operation. That is, the same temperature compensation value dV2 is applied to the plural instances of single-level reading continuously executed in the Vth tracking operation.

1.2.4 Soft Bit Reading Operation

Subsequently, one or more embodiments of the soft bit reading operation of the semiconductor memory device according to the first aspect will be described.

1.2.4.1 Outline of Soft Bit Reading Operation

Figure 13:
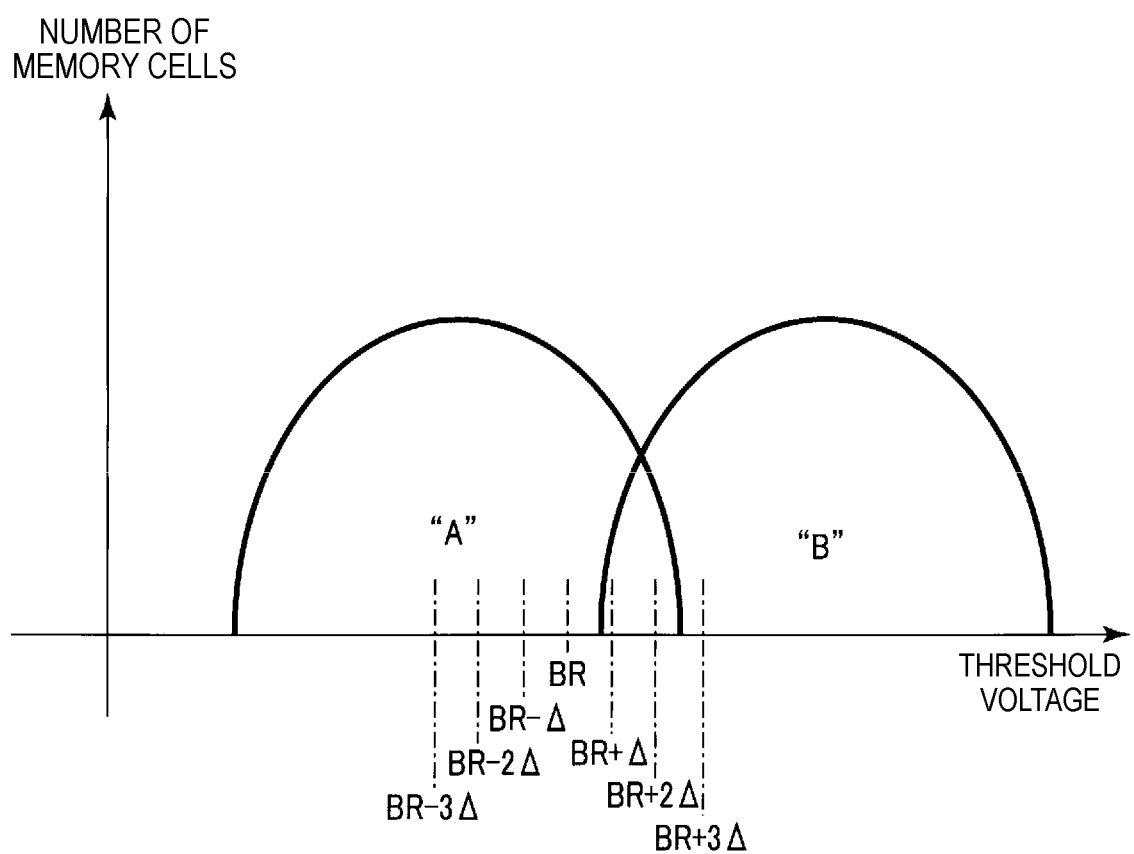
FIG. 13 is a schematic view for describing one or more embodiments of an outline of a soft bit reading operation of the semiconductor memory device according to the first aspect.

An outline of the soft bit reading operation according to the first aspect will be described. FIG. 13 is a schematic view for describing an outline of a soft bit reading operation of the semiconductor memory device according to the first aspect. FIG. 13 is a graph illustrating threshold voltage distributions of "A" level and "B" level as an example of threshold voltage distributions of the memory cell transistor MT group.

As illustrated in FIG. 13, the soft bit reading operation includes normal reading and plural shift readings shifted from the normal reading. In the example of FIG. 13, the normal reading corresponds to the read voltage BR as the standard value. Then, each of the plural shift readings corresponds to a read voltage (BR±3Δ, BR±2Δ, and BR±Δ) shifted by ±3Δ, ±2Δ, and ±Δ, for example, with respect to the read voltage BR of the normal reading as the standard value. That is, by the soft bit reading operation, the reading operation is executed by seven different read voltages (BR−3Δ, BR−2Δ, BR−Δ, BR, BR+Δ, BR+2Δ, and BR+3Δ), for example, to read seven read data. In the soft bit reading operation, the plural reading operations are consecutively executed.

The ECC circuit 13 estimates the threshold voltage distributions of the group of memory cell transistors MT by using the plural pieces of read data consecutively read by the soft bit reading operation. As a result, the ECC circuit 13 may perform error correction with higher accuracy than error correction based on only one read data.

1.2.4.2 Details of Soft Bit Reading Operation

Figure 14:
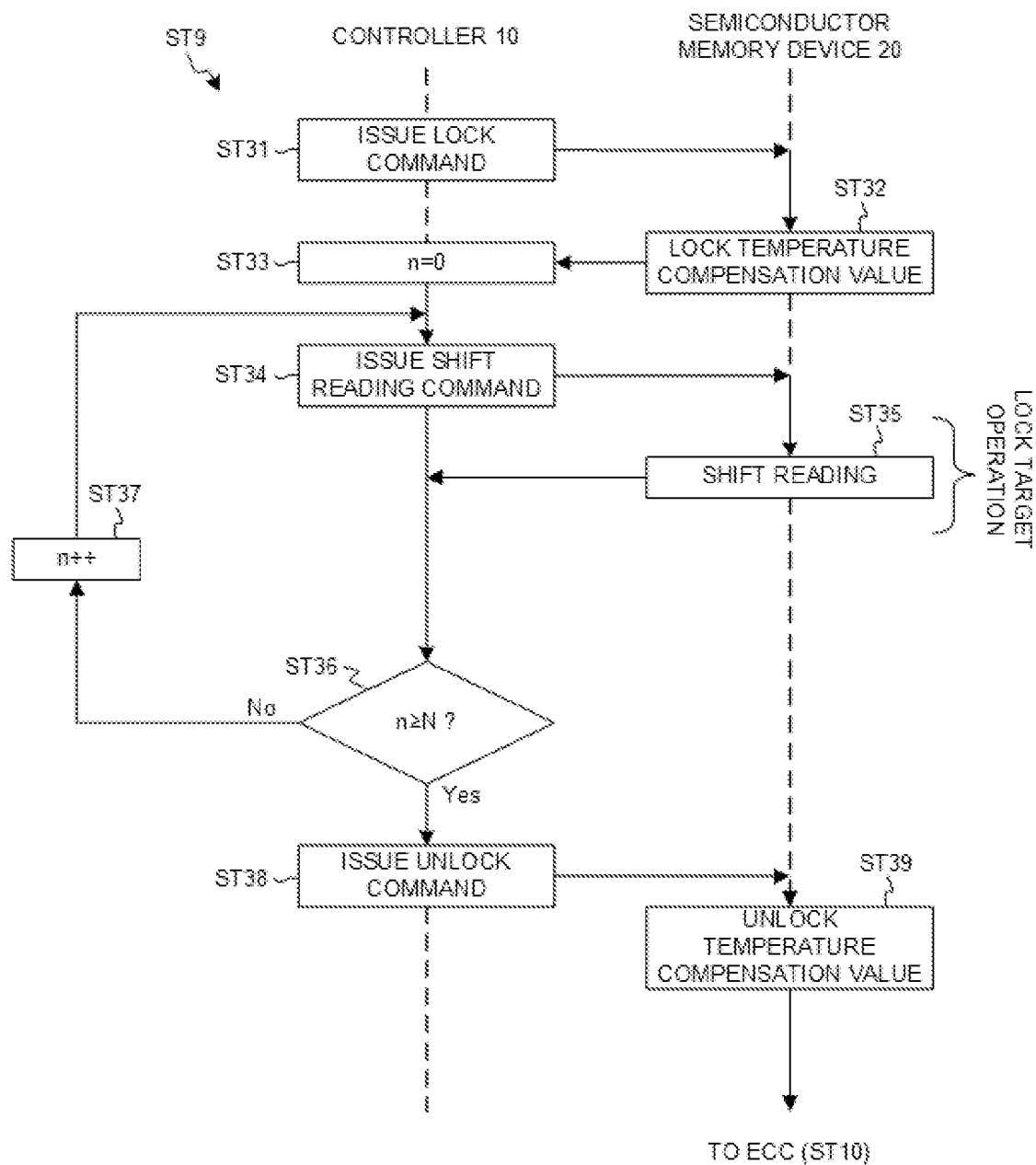
FIG. 14 is a flowchart for describing one or more embodiments of the soft bit reading operation of the memory system according to the first aspect.

Subsequently, the details of the soft bit reading operation in the memory system according to the first aspect will be described. FIG. 14 is a flowchart for describing one or more embodiments of the soft bit reading operation of the memory system according to the first aspect. Operations ST31 to ST39 illustrated in FIG. 14 correspond to operation ST9 in FIG. 8.

As illustrated in FIG. 14, in operation ST31, the controller 10 issues the lock command "XXh".

In operation ST32, the semiconductor memory device 20 determines the temperature compensation value dV2 based on the latest temperature information and fixes the temperature compensation value applied to the subsequent operation to the temperature compensation value dV2.

In operation ST33, the controller 10 initializes the loop processing executed in subsequent operations ST34 to ST37 (n=0 (n is an integer (0≤n≤N) (N is an arbitrary integer)).

In operation ST34, the controller 10 issues, to the semiconductor memory device 20, a shift reading command to designate a shift amount previously corresponding to a loop number n.

In operation ST35, the semiconductor memory device executes the shift reading to apply the temperature compensation value dV2 to a read voltage shifted from the standard value of the normal reading by the shift amount corresponding to the loop number n. The semiconductor memory device 20 transmits the read data of the shift reading to the controller 10. The controller 10 holds the read data of the shift reading in all loop numbers n.

In operation ST36, the controller 10 determines whether the loop processing is to be continued. Specifically, when the loop number n is determined to be less than a value N (operation ST36; no), the process proceeds to operation ST36 to increment the loop number n and thereafter, returns to operation ST34. Further, when the loop number n is equal to or larger than the value N (operation ST36; Yes), the process proceeds to operation ST38.

In operation ST38, the controller 10 issues the unlock command "YYh".

In operation ST39, the semiconductor memory device 20 resumes the updating of the temperature compensation value dV.

FIG. 15 is a table for describing the soft bit reading operation of the semiconductor memory device according to the first aspect. FIG. 15 illustrates, for example, a relationship between the loop number n and the shift amount applied to the shift reading executed at the loop number n. In the example of FIG. 15, a case where the value N is 6 is illustrated, and the shift amount applied to each of the total of seven shift readings from the loop number n=0 to the loop number n=6 is illustrated.

As illustrated in FIG. 15, when the loop number n=0, the shift amount is set to "0", and the same read voltage as that of the normal reading is applied as the standard value. When the loop number n=1, the shift amount is set to "−Δ", and a value smaller by Δ than the read voltage of the normal reading is applied as the read voltage. When the loop number n=2, the shift amount is set to "−2Δ", and a value smaller by 2Δ than the read voltage of the normal reading is applied as the read voltage. When the loop number n=3, the shift amount is set to "−3Δ", and a value smaller by 3Δ than the read voltage of the normal reading is applied as the read voltage. When the loop number n=4, the shift amount is set to "Δ", and a value larger by Δ than the read voltage of the normal reading is applied as the read voltage. When the loop number n=5, the shift amount is set to "2Δ", and a value larger by 2Δ than the read voltage of the normal reading is applied as the read voltage. When the loop number n=6, the shift amount is set to "3Δ", and a value larger by 3Δ than the read voltage of the normal reading is applied as the read voltage.

Figure 16:
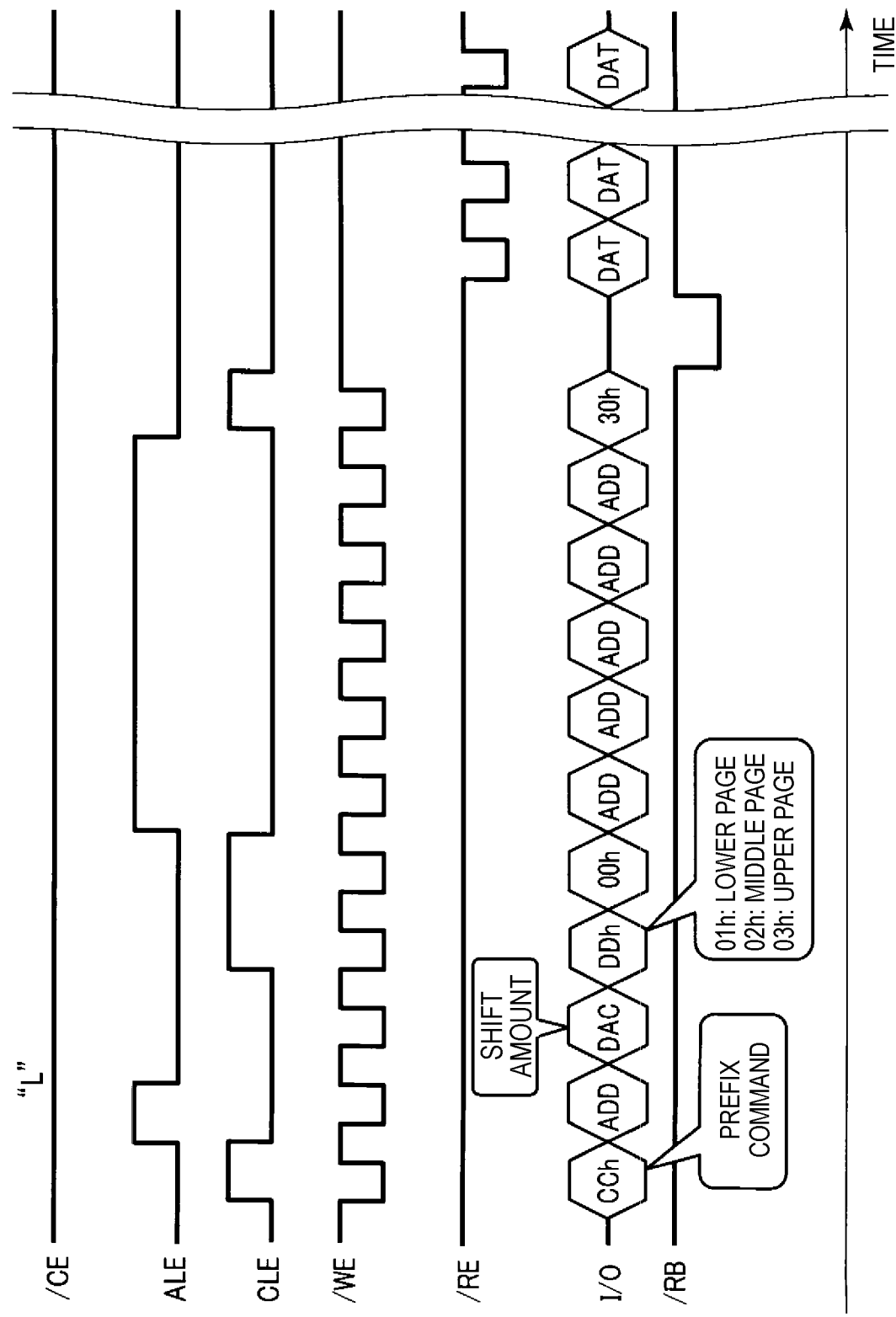
FIG. 16 is a command sequence for describing one or more embodiments of a shift reading operation of the semiconductor memory device according to the first aspect.

FIG. 16 is a command sequence for describing one or more embodiments of a shift reading operation of the semiconductor memory device according to the first aspect. The command sequence illustrated in FIG. 16 corresponds to operation ST35 in FIG. 14.

As illustrated in FIG. 16, the controller 10 first issues a prefix command "CCh". The command "CCh" is a command for declaring that the controller 10 performs the shift reading with respect to the semiconductor memory device 20. Subsequently, the controller 10 issues the address, for example, over one cycle. Thereafter, the controller 10 issues a DAC (D/A converter) value which is a value corresponding to the shift amount to the read voltage of the normal reading over, for example, four cycles. The DAC value is, for example, an indication value when the controller 10 designates the shift amount of the read voltage in the semiconductor memory device 20.

The controller 10 issues a command "DDh" and a first read command "00h" and transmits the issued command "DDh" and first read command "00h" to the semiconductor memory device 20, as in the normal reading. The command "DDh" indicates which page the subsequent address corresponds to. For example, upon receiving consecutive commands "01h" and "00h", the semiconductor memory device 20 recognizes that it is a lower page read, and upon receiving the commands "02h" and "00h", the semiconductor memory device 20 recognizes that it is a middle page read, and upon receiving commands "03h" and "00h", the semiconductor memory device 20 recognizes that it is an upper page read. The controller 10 subsequently issues the addresses (including the column address, the block address, and the page address) over, for example, 5 cycles. Thereafter, the controller 10 issues a second read command "30h".

When the command "30h" is stored in the register 24, the sequencer 25 controls the voltage generation circuit 26, the row decoder 27, and/or the sense amplifier module 28, to start the reading operation. The logic control circuit 23 sets the signal /RB at the "L" level so as to notify the controller 10 that the semiconductor memory device 20 is in the busy state. During the reading operation, data for one page is read from an area corresponding to the address transmitted from the controller 10. The logic control circuit 23 sets the signal /RB at the "H" level so as to notify the controller 10 that the semiconductor memory device 20 is in a ready state.

Since the other operations are the same as or similar to the single-level reading operation, redundant description thereof will be omitted.

By such an operation, plural times of shift reading repeatedly executed within the range of 0≤n<N in operations ST34 to ST37 become the lock target operation. That is, the same temperature compensation value dV2 is applied to the plural shift readings repeatedly executed in the soft bit reading operation.

1.3 Effects According to First Aspect

According to the first aspect, deterioration of data reading precision may be suppressed. Hereinafter, this effect will be described.

In the writing operation and the reading operation of a semiconductor memory device, the characteristics of a memory cell transistor vary depending on a temperature environment during an operation. Therefore, when performing the writing operation and the reading operation, the parameters such as the voltage applied to the memory cell transistor according to the temperature are corrected by a temperature compensation value. As a result, the variation of the characteristics of the memory cell transistor according to the temperature change may be accounted for. Furthermore, it is possible to avoid a situation where reliability is greatly influenced by an operating environment.

Meanwhile, in the semiconductor memory device, when the threshold voltage distribution of the memory cell transistor greatly varies due to, for example, disturbance or retention, the read data may include a bit error exceeding a correction capability of the ECC circuit. In this case, techniques such as Vth tracking and soft bit reading are used as techniques for improving the reliability of the read data and reducing the bit errors to the extent that the bit errors are capable of being corrected by the second error correction. Both the Vth tracking and the soft bit reading continuously perform the plural reading operations in order to obtain optimum read data.

However, when a temperature change occurs during the Vth tracking or soft bit reading operation, there is a possibility that different temperature compensation values are applied before and after the temperature change occurs among the plural reading operations.

FIG. 17 is a schematic view for describing an outline of an operation of the semiconductor memory device according to a comparative example. FIG. 17 illustrates a voltage applied to the word line WL when the temperature change corresponding to a change in the temperature compensation value dV occurs between a time before the number of loops n=3 and a time after the number of loops n=4 in the soft bit reading operation, as an example. In this manner, when different temperature compensation values dV are applied during the soft bit reading operation, the shift amount of the read voltage during consecutive plural reading operations is not constant. Specifically, the shift amount between the read voltage BR and the read voltage BR+Δ is different from the shift amount between the other read voltages. However, the soft bit decoding processing by the ECC circuit 13 is executed assuming that the same temperature compensation value dV is applied to all read voltages. That is, for example, the ECC circuit 13 executes the soft bit decoding processing on the premise that the shift amount between all read voltages is constant. For this reason, when the state as illustrated in the example of FIG. 17 occurs, the reliability of the soft bit decoding processing by the ECC circuit 13 decreases, and as a result, there is a possibility that optimum error correction will not be performed.

In one or more embodiments according to the first aspect, upon receiving the lock command "XXh", the sequencer 25 determines the temperature compensation value dV2 according to the temperature based on the temperature information of the temperature after receiving the lock command "XXh". Then, the sequencer 25 locks the updating of the temperature compensation value dV to a value different from the temperature compensation value dV2. As a result, when the lock command "XXh" is consecutively received before the plural data reading operations such as the Vth tracking and the soft bit read, the temperature compensation value dV2 is prevented from being updated in the course of plural times of data reading. Therefore, it is possible to suppress the lowering of the reliability precision of the subsequent ECC and further to suppress the deterioration of the reading accuracy of the data.

Upon receiving the unlock command "YYh", the sequencer 25 resumes the updating of the temperature compensation value dV. As a result, the temperature compensation value dV2 locked once may be updated again. Therefore, the compensation value dV based on the latest temperature information may be applied in the operation after the Vth tracking or the soft bit reading is terminated.

The controller 10 issues the lock command "XXh" when the error correction by the ECC circuit 13 is unsuccessful. As a result, the Vth tracking or the soft bit reading operation fixed to the temperature compensation value dV2 may be promptly executed with respect to the read data for which error correction is unsuccessful.

After issuing the unlock command "YYh", the controller 10 executes the error correction by the ECC circuit 13. As a result, the reading operation using the optimum read voltage obtained by the Vth tracking may be executed using the latest temperature compensation value.

The controller 10 executes the error correction by the ECC circuit 13 after the soft bit reading operation is terminated. As a result, it is possible to perform the error correction based on plural pieces of read data obtained by the soft bit reading operation.

2. Other Modifications

The present disclosure is not limited to the embodiments according to the first aspect described herein, and various modifications to the first aspect may be made. According to the first aspect, descriptions have been made of a case where 3 bits are capable of being held per memory cell transistor MT (TLC: Triple Level Cell), but the first aspect is not limited thereto. For example, the memory cell transistor MT may hold 2 bits (MLC: Multi Level Cell), or may hold 4 bits or more.

The following specifications may be applied to at least some of the embodiments described herein.

In a multi-level reading operation (read), the voltage applied to a word line selected for the A level reading operation is, for example, between 0 V and about 0.55 V. The corresponding voltage is not limited thereto, and may be in any range selected from about 0.1 V to about 0.24 V, about 0.21 V to about 0.31 V, about 0.31 V to about 0.4 V, about 0.4 V to about 0.5 V, and about 0.5 V to about 0.55 V.

The voltage applied to a word line selected for the B level reading operation is, for example, between about 1.5 V and about 2.3 V. The corresponding voltage is not limited thereto and may be in any range selected from about 1.75 V to about 1.8 V, about 1.8 V to about 1.95 V, about 1.95 V to about 2.1 V, and about 2.1 V to about 2.3 V.

The voltage applied to a word line selected for the C level reading operation is, for example, between about 3.0 V and about 4.0 V. The corresponding voltage is not limited thereto and may be in any range selected from about 3.0 V to about 3.2 V, about 3.2 V to about 3.4 V, about 3.4 V to about 3.5 V, about 3.5 V to about 3.7 V, and about 3.7 V to about 4.0 V.

A reading operation time (tR) may be in any range selected from, for example, about 25 microseconds (μs) to about 38 μs, about 38 μs to about 70 μs, and about 70 μs to about 80 μs.

The writing operation includes a program operation and a verifying operation. In the writing operation, the voltage initially applied to a word line selected during the program operation is, for example, between about 13.7 V and about 14.3 V. The corresponding voltage is not limited thereto, and may be in any range selected from, for example, about 13.7 V to about 14.0 V and about 14.0 V to about 14.7 V.

The voltage initially applied to a selected word line when writing an odd-numbered word line and the voltage initially applied to a selected word line when writing an even-numbered word line may be changed.

When the program operation is performed by an incremental operation pulse program (ISPP) method, a step-up voltage may be set to, for example, about 0.5 V.

The voltage applied to a non-selected word line may be, for example, between about 7.0 V and about 7.3 V. The corresponding voltage is not limited thereto, and may be, for example, between about 7.3 V and about 8.4 V or about 7.0 V or less.

A pass voltage applied may be changed depending on whether the non-selected word line is an odd-numbered word line or an even-numbered word line.

A writing operation time (tProg) may be in any range selected from, for example, about 1700 μs to about 1800 μs, about 1800 μs to about 1900 μs, and about 1900 μs to about 2000 μs.

In the erasing operation, a voltage initially applied to a well, which is formed on a semiconductor substrate and above which a memory cell is arranged, is, for example, between about 12 V and about 13.7 V. The voltage is not limited thereto, and may be in any range selected from, for example, about 13.7 V to about 14.8 V, about 14.8 V to about 19.0 V, about 19.0 to about 19.8 V, and about 19.8 V to about 21 V.

An erasing operation time (tErase) may be in any range selected from, for example, about 3000 μs to about 4000 μs, about 4000 μs to about 5000 μs, and about 4000 μs to about 9000 μs.

The memory cell has a charge storage layer disposed on the semiconductor substrate (silicon substrate) through a tunnel insulating film having a film thickness of about 4 nanometers (nm) to about 10 nm. The charge storage layer may have a stacking structure of an insulating film of silicon nitride (SiN) or silicon oxynitride (SiON) having a film thickness of about 2 nm to about 3 nm and polysilicon having a film thickness of about 3 nm to about 8 nm. Further, a metal such as Ru may be added to the polysilicon. The insulating film is formed on the charge storage layer. The insulating film has a silicon oxide film having a film thickness of about 4 nm to about 10 nm and sandwiched between, for example, a lower high-k film having a film thickness of about 3 nm to about 10 nm and an upper high-k film having a film thickness of about 3 nm to about 10 nm. As the high-k film, hafnium oxide (HfO) or the like may be exemplified. Further, the film thickness of the silicon oxide film may be thicker than the film thickness of the high-k film. On the insulating film, a control electrode having a film thickness of about 30 nm to about 70 nm is formed through a work function adjusting material having a film thickness of about 3 nm to about 10 nm. Here, the work function adjusting material is a metal oxide film such as tantalum oxide (TaO), or a metal nitride film such as tantalum nitride (TaN). As the control electrode, tungsten (W) or the like may be used.

An air gap may be formed between memory cells.

As used herein, the term "about" is used to describe and account for small variations. When used in conjunction with an event or circumstance, the term "about" can refer to instances in which the event or circumstance occurs precisely as well as instances in which the event or circumstance occurs to a close approximation. For example, when used in conjunction with a numerical value, the term "about" can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

As used herein, the singular terms "a," "an," and "the" may include plural referents unless the context clearly dictates otherwise. In the description of some embodiments, a component provided "on," "above," or "over" another component can encompass cases where the former component is directly on (e.g., in physical contact with) the latter component, as well as cases where one or more intervening components are located between the former component and the latter component.

While certain embodiments have been described, these embodiments have been presented byway of example only, and are not intended to limit the scope of the present disclosure. Indeed, the embodiments described herein may be embodied in a variety of other forms and may be combined; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor memory system comprising:
a memory cell transistor;
a word line coupled to the memory cell transistor;
a temperature detection element configured to detect a temperature; and
a control unit,
wherein the control unit is configured to determine, responsive to receiving a first command from a controller, a first temperature and a compensation value for a read voltage designated by the controller according to the first temperature, and to lock updating of the compensation value.

2. The semiconductor memory system of claim 1, wherein the control unit is configured to determine a voltage to apply to the word line based on the read voltage and the compensation value.

3. The semiconductor memory system of claim 2, wherein the control unit is configured to unlock the updating responsive to receiving a second command from the controller.

4. The semiconductor memory system of claim 3, wherein the control unit is configured to determine a second temperature responsive to receiving the second command from the controller, and determine the compensation value of the voltage to apply to the word line after receiving the second command according to the second temperature.

5. The semiconductor memory system of claim 4, further comprising the controller.

6. The semiconductor memory system of claim 5, wherein the controller is configured to issue the first command to the semiconductor memory device responsive to an error correction of data read from the semiconductor memory device being unsuccessful.

7. The semiconductor memory system of claim 6, wherein the controller is configured to read the data from the semiconductor memory device by using a plurality of read voltages having different magnitudes after issuing the first command and until issuing the second command.

8. The semiconductor memory system of claim 6, wherein the controller is configured to execute the error correction based on the data read from the semiconductor memory device after issuing the second command.

9. The semiconductor memory system of claim 7, wherein the data read from the semiconductor memory device corresponds to the plurality of read voltages, and the controller is configured to execute the error correction based on the data read from the semiconductor memory device corresponding to the plurality of read voltages.

10. The semiconductor memory system of claim 9, wherein the error correction comprises a hard bit decoding process.

* * * * *